(12) United States Patent
Lin et al.

(10) Patent No.: US 11,894,273 B2
(45) Date of Patent: Feb. 6, 2024

(54) METHODS OF FORMING A SEMICONDUCTOR DEVICE

(71) Applicant: Taiwan Semiconductor Manufacturing Company, Ltd., Hsinchu (TW)

(72) Inventors: Meng-Han Lin, Hsinchu (TW); Te-An Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 45 days.

(21) Appl. No.: 17/844,078

(22) Filed: Jun. 20, 2022

(65) Prior Publication Data

US 2022/0328472 A1 Oct. 13, 2022

Related U.S. Application Data

(62) Division of application No. 16/861,215, filed on Apr. 29, 2020, now Pat. No. 11,404,410.

(51) Int. Cl.
| | |
|---|---|
| *H01L 21/82* | (2006.01) |
| *H01L 21/8234* | (2006.01) |
| *H01L 27/06* | (2006.01) |
| *H01L 29/417* | (2006.01) |
| *H01L 29/06* | (2006.01) |

(52) U.S. Cl.
CPC ........ *H01L 21/823418* (2013.01); *H01L 21/823462* (2013.01); *H01L 21/823475* (2013.01); *H01L 27/0617* (2013.01); *H01L 29/0653* (2013.01); *H01L 29/41725* (2013.01)

(58) Field of Classification Search
CPC ..... H01L 21/823462; H01L 21/823418; H01L 21/823456; H01L 21/823481; H01L 21/823857; H01L 21/32139; H01L 21/823814; H01L 21/823878; H01L 21/28518; H01L 21/762; H01L 21/76202; H01L 21/823835; H01L 27/0617; H01L 21/823475; H01L 29/0653; H01L 29/41725; H01L 21/76816; H01L 23/485; H01L 27/088
See application file for complete search history.

(56) References Cited

U.S. PATENT DOCUMENTS

| | | | |
|---|---|---|---|
| 8,518,775 B2* | 8/2013 | Liu | H01L 21/823462 438/258 |
| 9,887,211 B2* | 2/2018 | Yamamoto | H01L 29/6653 |

(Continued)

*Primary Examiner* — Shouxiang Hu
(74) *Attorney, Agent, or Firm* — JCIPRNET

(57) ABSTRACT

A semiconductor device includes a substrate having a first region and a second region, a first gate structure disposed on the substrate within the first region, a first S/D region, a first S/D contact, a second gate structure on the substrate within the second region, a second S/D region and a second S/D contact. The first S/D region is disposed in the substrate within the first region and beside the first gate structure. The first S/D contact is connected to the first S/D region. The second S/D region is disposed in the substrate within the second region and beside the second gate structure. The second S/D contact is connected to the second S/D region. The contact area between the second S/D region and the second S/D contact is larger than a contact area between the first S/D region and the first S/D contact.

20 Claims, 27 Drawing Sheets

(56) References Cited

U.S. PATENT DOCUMENTS

2017/0345750 A1* 11/2017 Tsuboi ................ H01L 27/1207
2019/0006380 A1*  1/2019 Liu ....................... H01L 29/788
2020/0058664 A1*  2/2020 Lin ....................... H10B 41/35

* cited by examiner

METHODS OF FORMING A SEMICONDUCTOR DEVICE

CROSS-REFERENCE TO RELATED APPLICATION

This application is a divisional application of and claims the priority benefit of a prior application Ser. No. 16/861,215, filed on Apr. 29, 2020. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, high voltage technology has been widely used in power management, regulators, battery protectors, DC motors, automotive circuits, panel display drivers, etc. On the other hand, low voltage technology is typically used for logic cores, microprocessors, and microcontrollers. Some modern IC designs integrate both high voltage and low voltage devices on a single chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1 to FIG. 24A, FIG. 24B are cross-sectional views illustrating various intermediate stages in the manufacturing of a semiconductor device.

DETAILED DESCRIPTION

Figure 1:
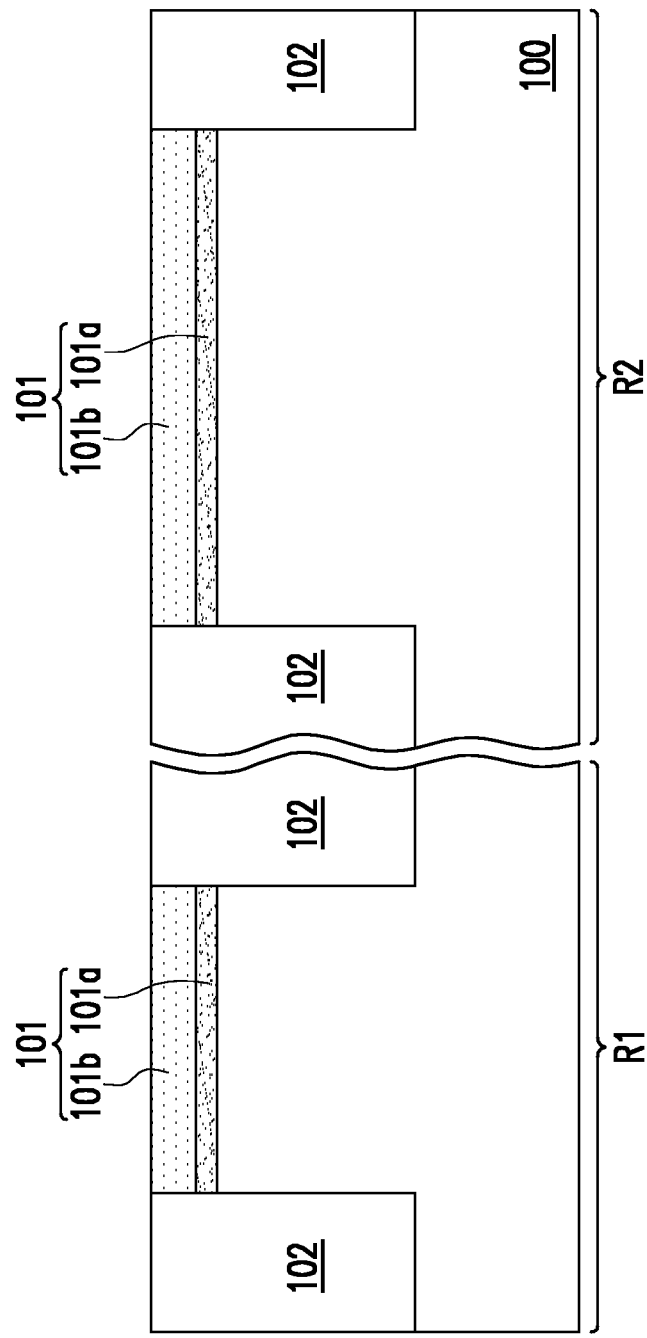

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-k metal gate (HKMG) technology has become one of the front-runners for the next generation of complementary metal oxide semiconductor (CMOS) devices. HKMG technology incorporates a high-k dielectric to increase transistor capacitance and reduce gate leakage. A metal gate electrode is used to help with Fermi-level pinning and to allow the gate to be adjusted to low threshold voltages. By combining the metal gate electrode and the high-k dielectric, HKMG technology makes further scaling possible and allows integrated chips to function with reduced power consumption. HKMG technology can be used for memory devices, display devices, sensor devices, among other applications where a high voltage region is needed and incorporated in the integrated circuits to provide higher power and have higher breakdown voltage than conventional metal oxide semiconductor (MOS) devices.

Various embodiments of the disclosure are directed to provide a semiconductor device integrating high voltage device and low voltage device, and a method for forming the semiconductor device using HKMG technology.

FIG. 1 to FIG. 24A, FIG. 24B are schematic cross-sectional views illustrating a method of forming a semiconductor device according to some embodiments of the disclosure.

Referring to FIG. 1, a substrate 100 is provided. In some embodiments, the substrate 100 is a semiconductor substrate, such as a bulk semiconductor substrate, a semiconductor-on-insulator (SOI) substrate, or the like, which may be doped (e.g., with a p-type or an n-type dopant) or undoped. The substrate 100 may be a semiconductor wafer, such as a silicon wafer. Other substrates, such as a multi-layered or gradient substrate may also be used. In some embodiments, the semiconductor material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Isolation structures 102 are formed in the substrate 100 to define active regions. The isolation structures 102 may be shallow trench isolation (STI) structure, deep trench isolation (DTI) structure, or some other type of isolation structure. In some embodiments, the isolation structures 102 may be formed by the following process: a patterned mask layer 101 is formed on the substrate 100, the patterned mask layer 101 may be formed by forming a mask material on the substrate 100, and then patterning the mask layer using photolithograph and etching processes; In some embodiments, the patterned mask layer 101 includes a first layer 101a and a second layer 101b on the first layer 101a. The materials of the first layer 101a and the second layer 101b may be different. For example, the first layer 101 may include an oxide, such as silicon oxide, while the second layer 101b may include nitride, such as silicon nitride. Thereafter, by using the patterned mask layer 101 as an etching mask, the substrate 100 is etched to form isolation trenches. An insulating material (e.g. silicon oxide) is then formed to fill the isolation trenches and may cover the top surface of the patterned mask layer 101. A planarization process, such as CMP or an etch-back process, is performed to remove the excess insulating material over the top surface of the patterned mask layer 101, thereby forming the isolation structure 102. As such, active regions are defined in the substrate 100 through the isolation structure 102.

In some embodiments, the substrate 100 includes a first region R1 and a second region R2. The first region R1 may be a low-voltage device region configured for forming low-voltage device thereon, while the second region R2 may be a high-voltage device region configured for forming high-voltage device thereon. In some embodiments, the first region R1 borders the second region R2. In some other embodiments, the first region R1 and the second region R2 may be spaced from each other, and other regions (e.g., device regions, boundary regions, etc.) may be disposed between the first region R1 and the second region R2.

Figure 2:
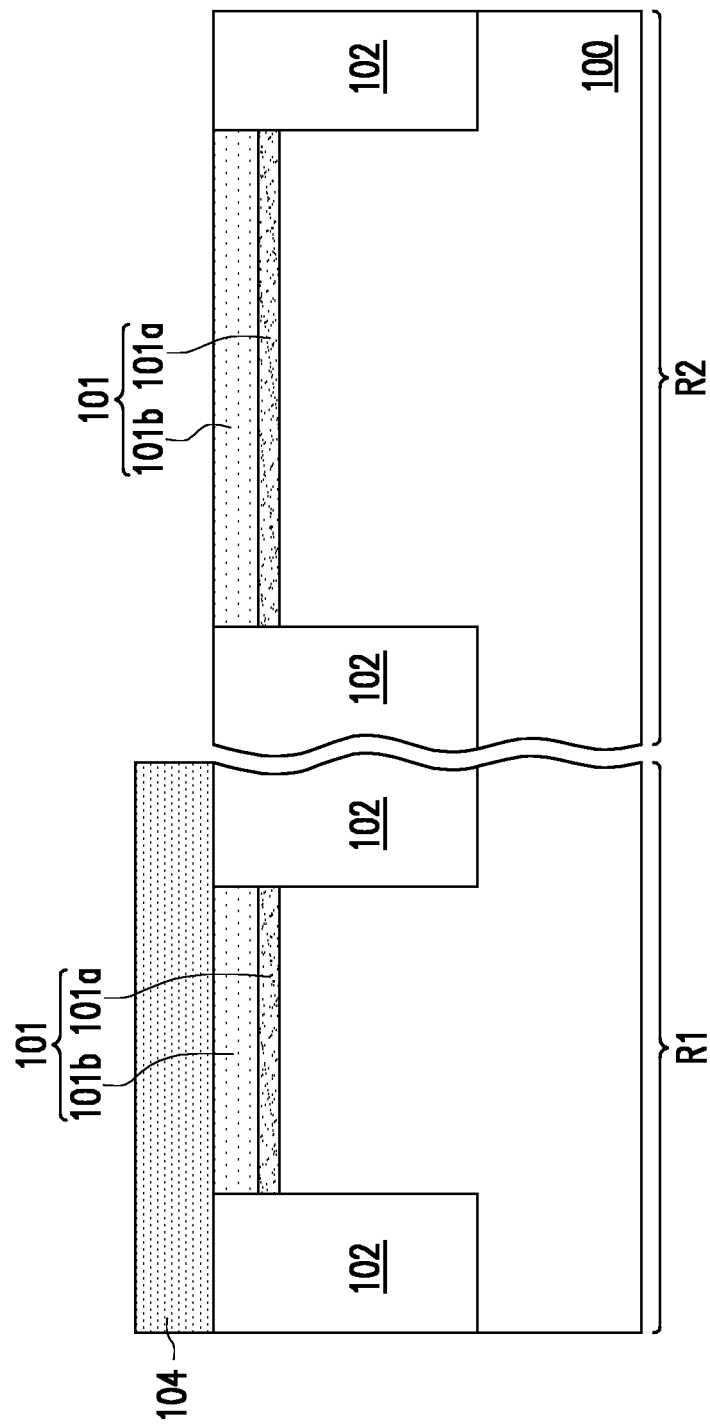

Referring to FIG. 2, a hard mask layer 104 is formed on the substrate 100 to cover the first region R1 and expose the second region R2. In some embodiments, the hard mark layer 104 is formed by forming a mask material layer over the substrate 100 in the first region R1 and the second region R2. Thereafter, the mask material layer over the substrate 100 of the second region R2 is removed by photolithograph and etching processes. The hard mask layer 104 includes a material different from the isolation structure 102 and the patterned mask layer 101. In some embodiments, the hard mask layer 104 includes an oxide such as silicon oxide, nitride such as silicon nitride, or the like, or combinations thereof, or any other suitable material different from silicon nitride and oxide. The hard mask layer 104 may be a single layer structure, such as a single SiN layer. In some embodiments, the hard mask layer 104 is a multi-layer structure including a bottom layer (such as SiN layer) and an upper layer (such as oxide layer) on the bottom layer, for example.

Figure 3:
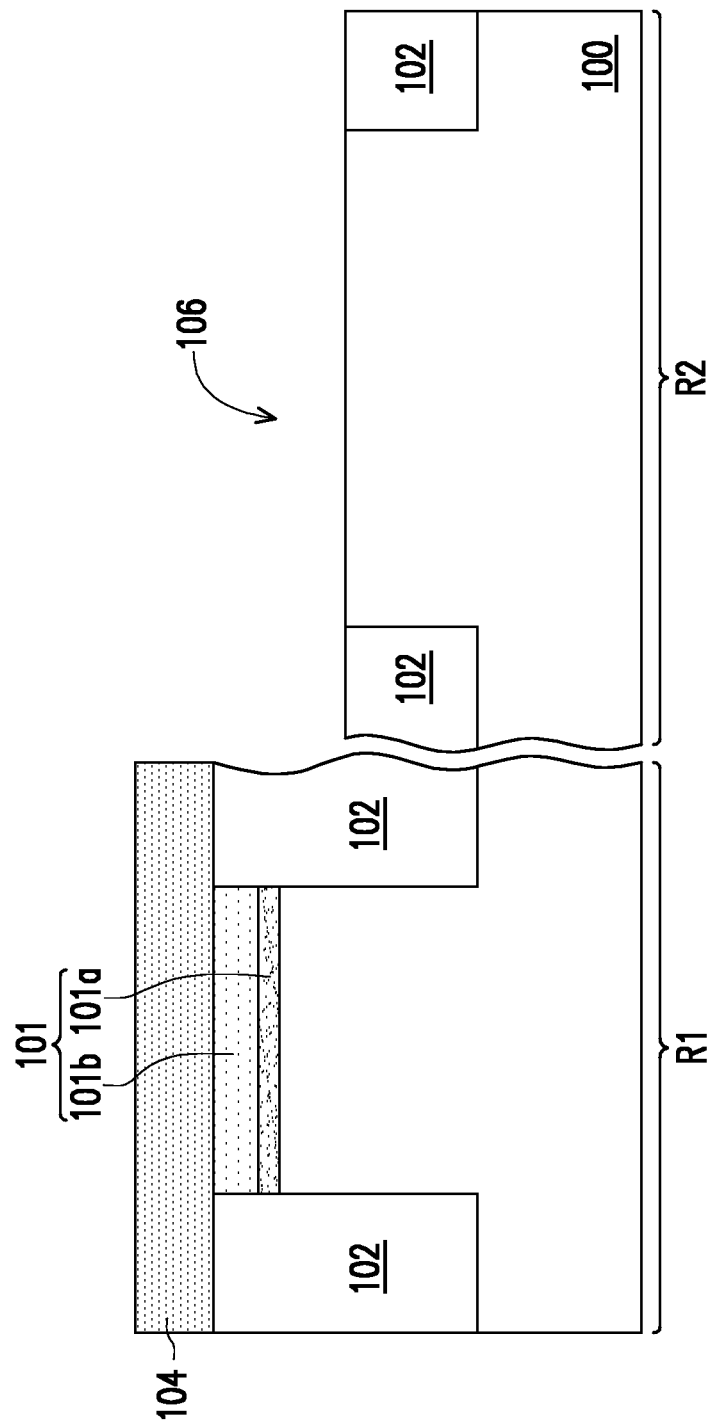

Referring to FIG. 3, the substrate 100 in the second R2 is recessed by etching process(es) using the hard mask layer 104 as an etching mask. In some embodiments, the etching process removes the patterned mask layer 101, a portion of the substrate 100 and/or portions of the isolation structure 102 in the second region R2, such that a recess 106 is formed in the substrate 100. The etching process may include dry etching, wet etching or a combination thereof. After the recessing process is performed, the substrate 100 in the second region R2 has a top surface lower than the substrate 100 in the first region R1. In some embodiments, the top surface of the isolation structures 102 in the second region R2 may be substantially coplanar with or higher than the top surface of the substrate 100 in the second region R2.

Figure 4:
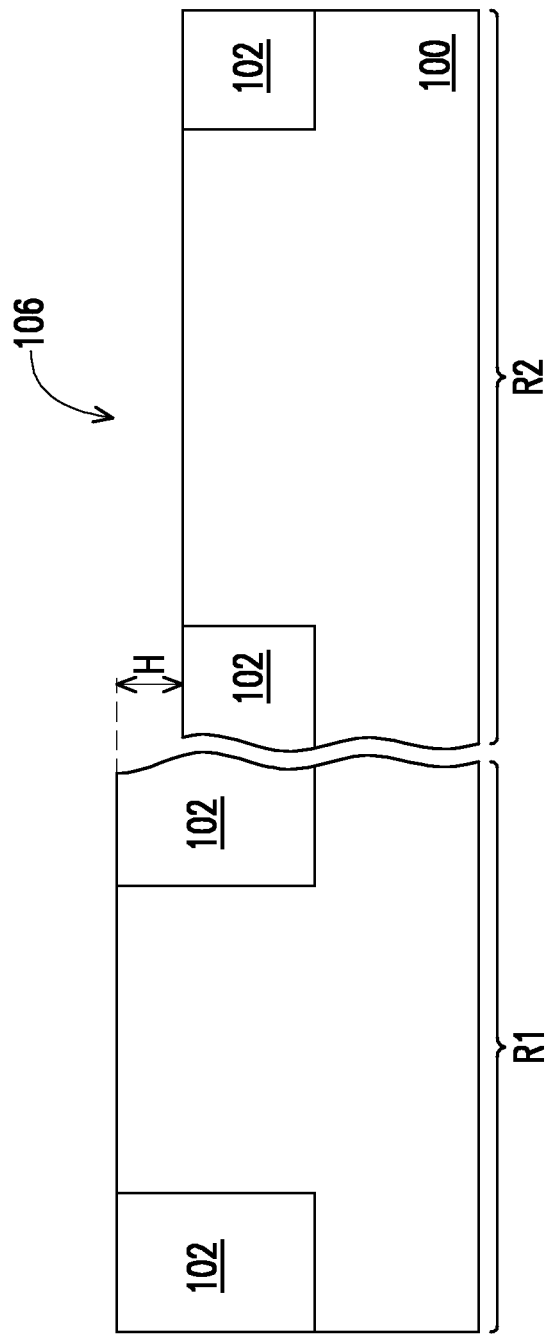

Referring to FIG. 3 and FIG. 4, thereafter, the hard mask layer 104 and the patterned mask layer 101 in the first region R1 are removed by etching processes, such as dry etching, wet etching or a combination thereof. Other suitable removal processes may also be used. In some embodiments, portions of the isolation structure 102 in the first region R1 adjacent to the patterned mask layer 101 may or may not be removed. After the removal process, the top surface of the isolation structure 102 in the first region R1 may be substantially coplanar with or higher than the top surface of the substrate 100 in the first region R1. The top surfaces of the isolation structures 102 and the substrate 100 in the first region R1 are higher than the top surfaces of the isolation structures 102 and the substrate 100 in the second region R2. A height difference H (i.e. the height of the recess 106 in the substrate 100) is existed between the substrate 100 in the first region R1 and the substrate 100 in the second region R2. In some embodiments, the second region R2 may also be referred to as a recessed second region R2. In other words, the substrate 100 in the second region R2 is recessed to have a top surface lower than the top surface of the substrate 100 in the first region R1.

Figure 5:
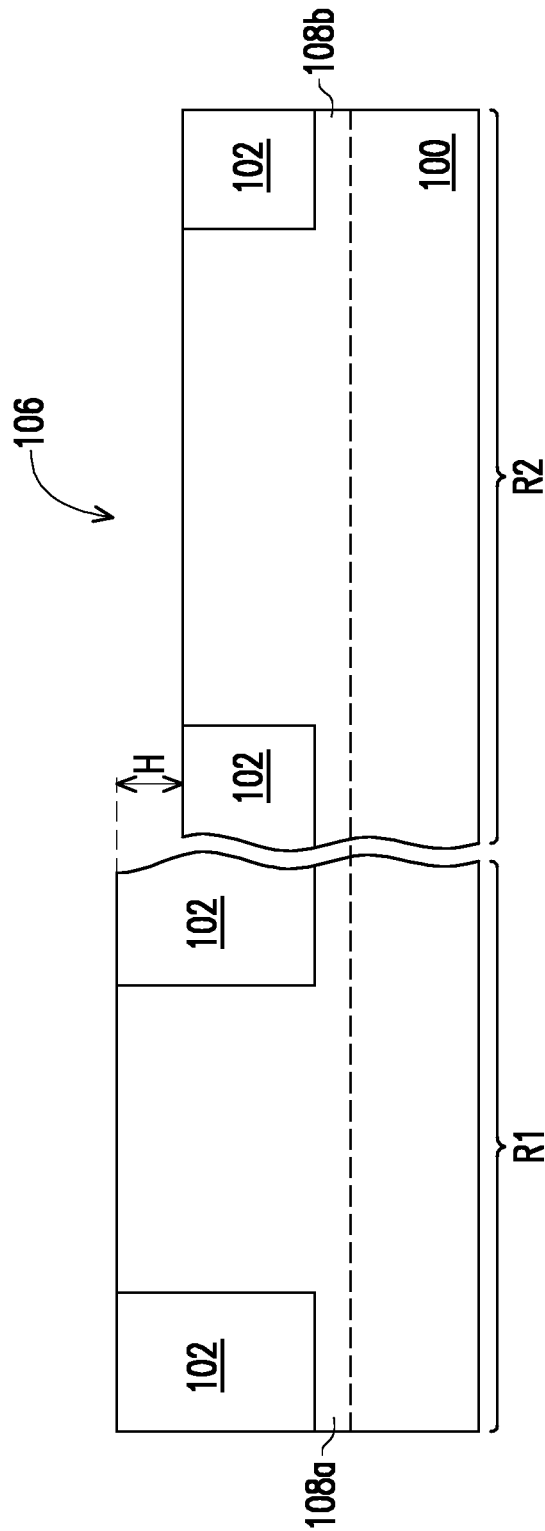

Referring to FIG. 5, a well region 108a is formed in the substrate 100 of the first region R1, and a well region 108b is formed in the substrate 100 of the second region 108b. The conductivity types, the depths, and/or the dopant concentrations of the well regions 108a and 108b may be the same or different, respectively. The well regions 108a and 108b may respectively be p-well including p-type dopants (such as boron or $BF_2^+$) or n-well including n-type dopants (such as phosphorus or arsenic). In some embodiments, the well region 108a and the well region 108b are successively formed in the substrate by implantation processes. For example, a first patterned mask is formed to cover the first region R2 and expose the second region R1, and a first implantation process is performed on the unmasked substrate 100 in the first region R1, thereby forming the well region 108a in the substrate 100 of the first region R1. Thereafter, the first patterned mask is removed, and a second patterned mask layer is formed to cover the first region R1 and expose the second region R2, a second implantation process is then performed on the unmasked substrate 100 in the second region R2, thereby forming the well region 108b in the second region R2.

Figure 6:
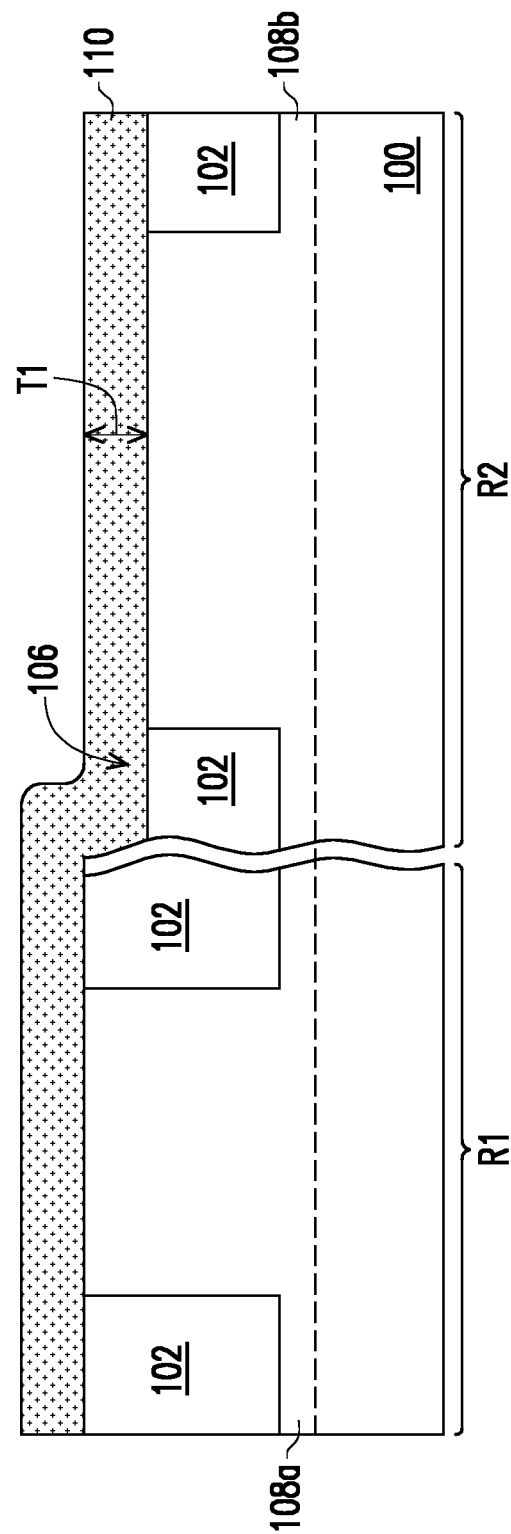

Referring to FIG. 6, a dielectric material layer 110 is formed on the substrate 100. The dielectric material layer 110 may include an oxide, such as silicon oxide. In some embodiments, the dielectric material layer 110 is formed by a suitable deposition process, such as chemical vapor deposition (CVD). The dielectric material layer 110 covers the substrate 100 in the first region R1 and the second region R2. In some embodiments, the dielectric material layer 110 is formed to have a thickness T substantially equal to the height H (FIG. 4) of the recess 106 of the substrate 100. In other word, the dielectric material layer 110 may substantially fill up the recess 106.

Figure 7:
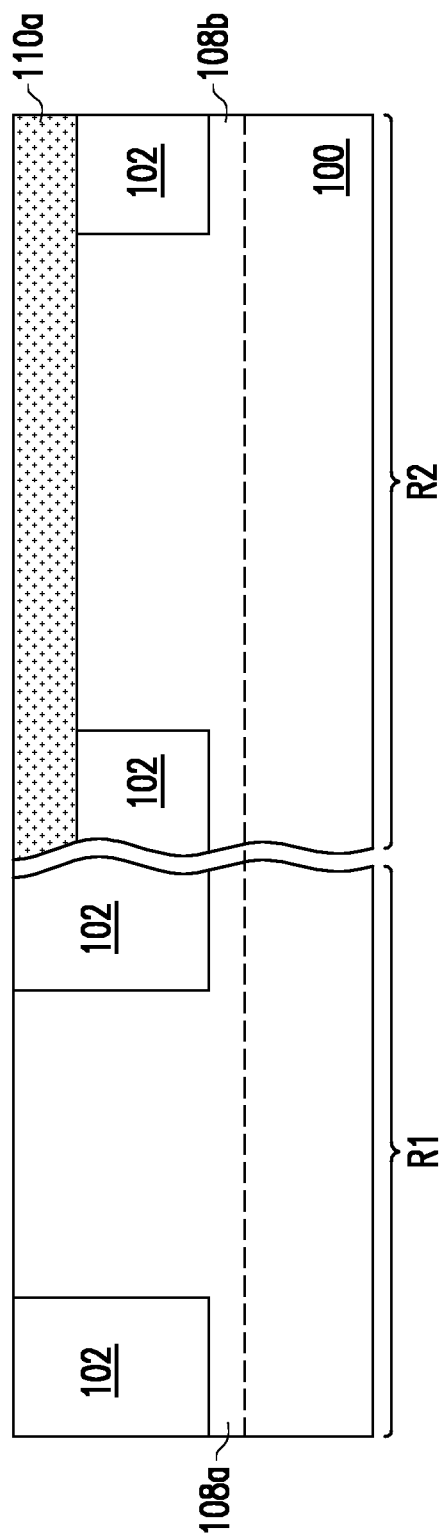

Referring to FIG. 6 and FIG. 7, a removal process is performed to remove the dielectric material layer 110 in the first region R1, and remaining a dielectric layer (e.g. oxide layer) 110a on the substrate 100 in the second region R2. The removal process may include photolithograph and etching processes (e.g. wet etching), but the disclosure is not limited thereto. In some embodiments, the top surface of dielectric layer 110a may be substantially coplanar with the top surface of the substrate 100 in the first region R1, but the disclosure is not limited thereto.

Figure 8:
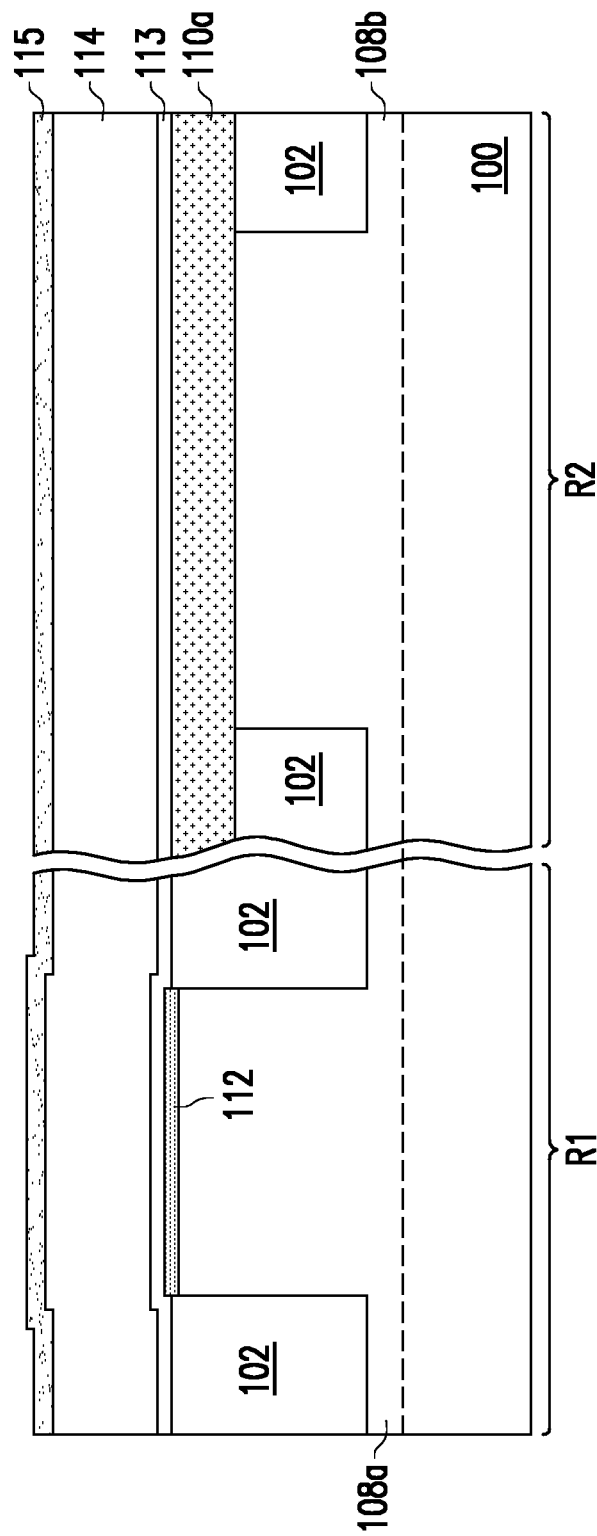

Referring to FIG. 8, an interfacial material layer 112 is formed on the substrate 100. In some embodiments, the interfacial material layer 112 includes an oxide, such as silicon oxide. The interfacial material layer 112 may be formed on the surface of substrate 100 by a thermal oxidation process. In some embodiments, since the substrate 100 in the second region R2 is covered by the dielectric layer 110a, the interfacial material layer 112 may be formed on the surface of the substrate 100 in the first region R1, without being formed in the second region R2. However, the disclosure is not limited thereto. In some other embodiments, the interfacial material layer 112 may be formed by deposition process (e.g. CVD) and may extend to cover the substrate 100 and isolation structure 102 in both first region R1 and second region R2.

Thereafter, a dielectric material layer 113, a dummy gate layer 114, a hard mask material layer 115 are sequentially formed over the substrate 100 of the first region R1 and second region R2 by suitable deposition processes, such as CVD, physical vapor deposition (PVD) or the like, or combinations thereof. The dielectric material layer 113 includes a high-k dielectric material which may have a dielectric constant greater than 4 or 10. The high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfSiO, HfAlO, HfSiO, or the like, or combinations thereof, or other suitable high-k dielectric material. The dummy gate material layer 114 may include polysilicon. The hard mask 115 may include a nitride or an oxynitride, such as silicon nitride or silicon oxynitride.

Figure 9:
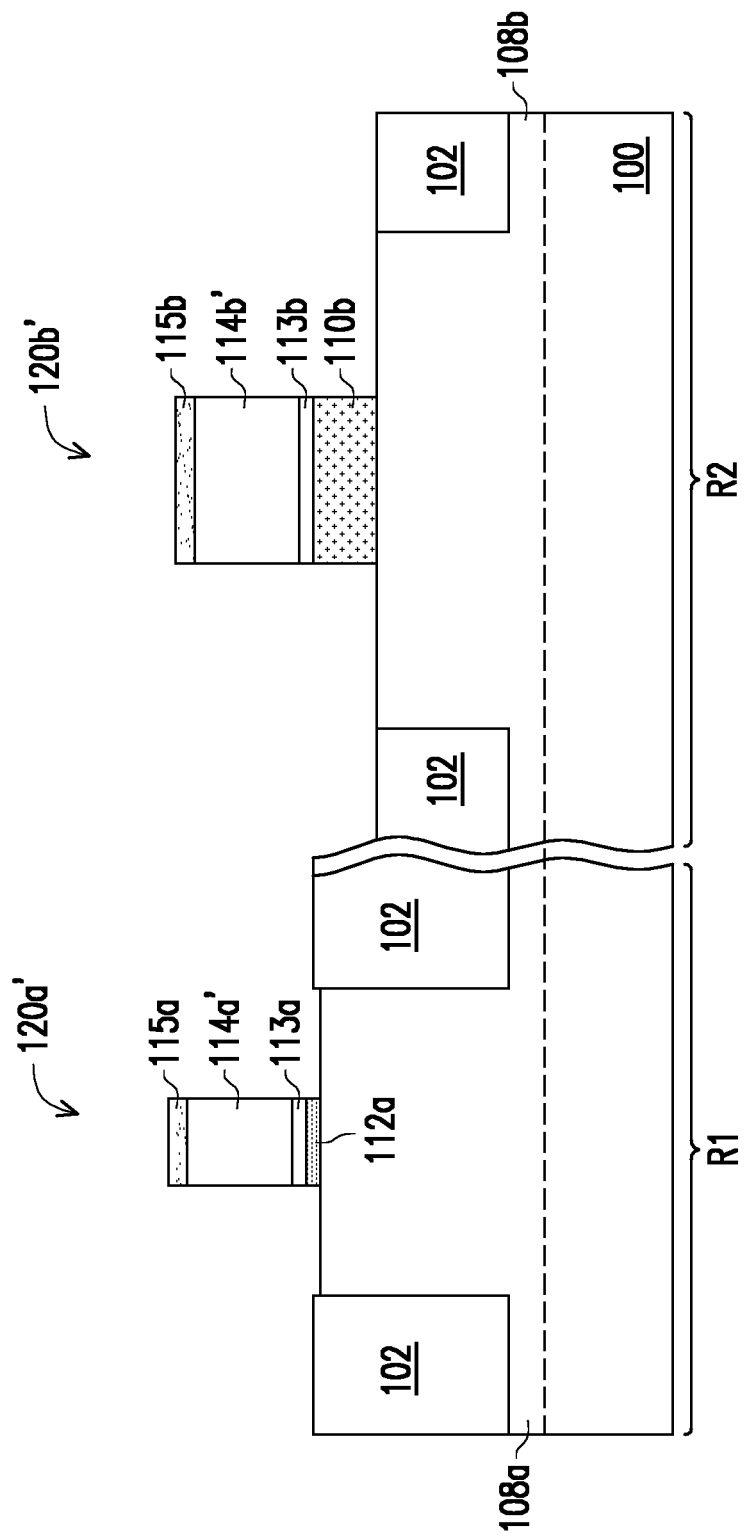

Referring to FIG. 8 and FIG. 9, the interfacial material layer 112, the oxide layer 110a, the high-k dielectric layer 113, the dummy gate layer 114 and the hard mask material layer 115 are patterned to form a stack structure 120a' on the substrate 100 in the first region R1 and a stack structure 120b' on the recessed substrate 100 in the second region R2. The patterning process may include photolithograph and etching processes. The stack structure 120a' includes an interfacial layer 112a, a high-k dielectric layer 113a, a dummy gate 114a' and a hard mask 115a, while the stack structure 120b' includes a gate oxide layer 110b, a high-k dielectric layer 113b, a dummy gate 114b' and a hard mask 115b. In some embodiments, the width of the stack structure 120b' is larger than the width of the stack structure 120a', but the disclosure is not limited thereto.

Figure 10:
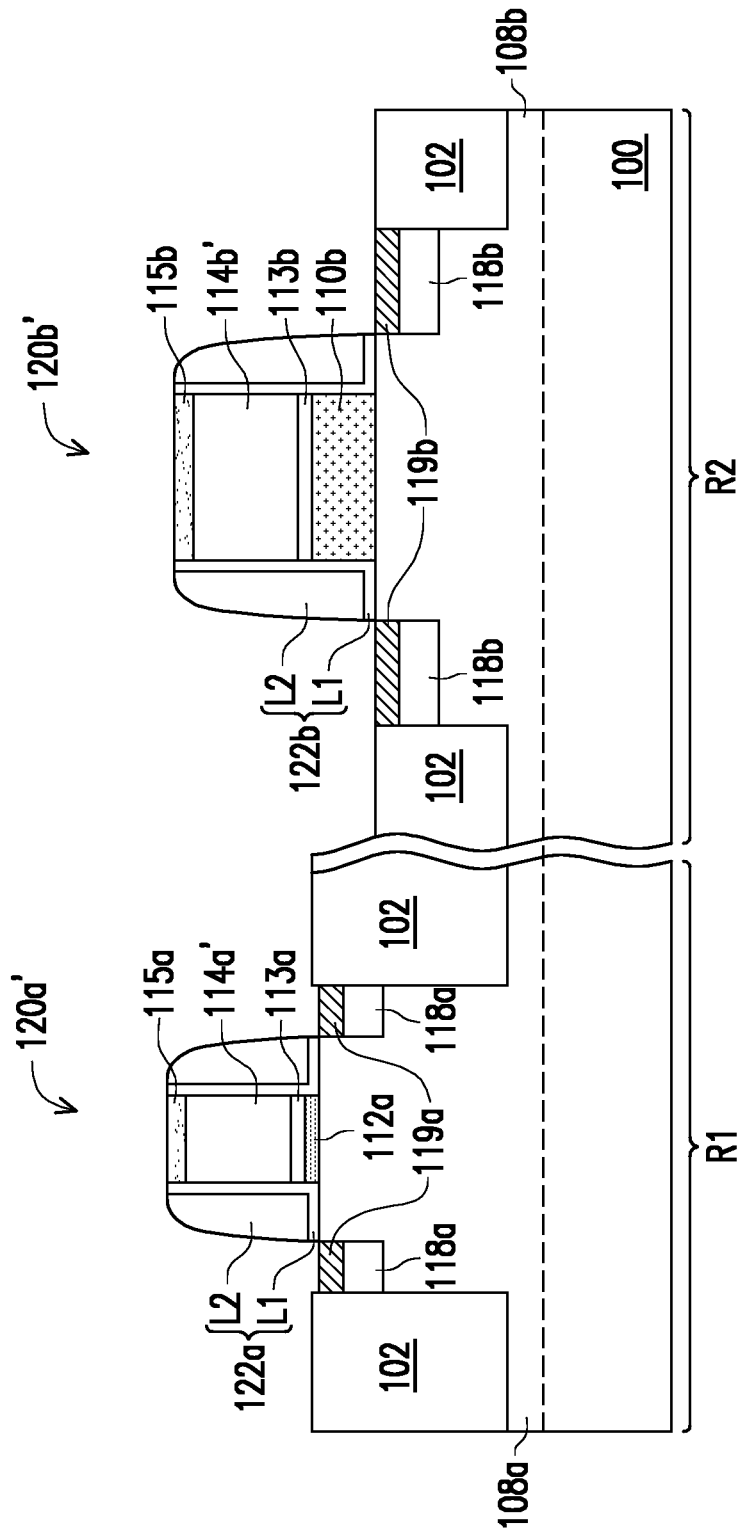

Referring to FIG. 10, spacers 122a are formed on sidewalls of the stack structure 120a', and spacers 122b are formed on sidewalls of the stack structure 120b'. The spacers 122a and 122b may respectively include a first layer L1 and a second layer L2 on the first layer L1. The first layer L1 and the second layer L2 may be formed of different materials. For example, the first layer L1 may include an oxide, such as silicon oxide. The second layer L2 may include a nitride, such as silicon nitride. In some embodiments, the first layer L1 is L-shaped or the like. The spacers 122a and 122b may be formed by forming a first spacer material layer and a second spacer material layer over the substrate 100 to cover top surfaces and sidewalls of the stack structures 120a' and 120b'. Thereafter, an etching process, such as etching back process, may be performed to remove horizontal portions of the first and second spacer material layers, thereby forming the spacers 122a and 122b on sidewalls of the stack structures 120a' and 120b'.

Thereafter, source/drain (S/D) regions 118a are formed in the substrate 100 on sides of the stack structure 120a', and source/drain regions 118b are formed in the substrate 100 on sides of the stack structure 120b'. The S/D regions 118a and 118b may be doped regions configured for p-type MOS filed effect transistor (MOSFET) or n-type MOSFET, p-type fin-type field effect transistor (FinFET), or n-type FinFET, respectively. The conductivity types of the S/D regions 118a and 118b are opposite to the conductivity types of the corresponding well regions 108a, 108b, respectively. The S/D regions 118a and 118b may respectively include p-type dopants, such as boron, $BF_2^+$, or n-type dopants, such as phosphorus, arsenic. The conductivity types, the depths, and the dopant concentrations of the S/D regions 118a and 118b may be the same or different, respectively. The source/drain regions 118a and 118b may be formed by implantation process (es) successively or simultaneously.

In some embodiments, the S/D regions 118a and 118b have silicide layers 119a and 119b formed thereon, respectively. The silicide layers 119a and 119b include nickel silicide (NiSi), cobalt silicide (CoSi), titanium silicide (TiSi), tungsten silicide (WSi), molybdenum silicide (MoSi), platinum silicide (PtSi), palladium silicide (PdSi), CoSi, NiCoSi, NiPtSi, Ir, PtIrSi, ErSi, YbSi, PdSi, RhSi, or NbSi, or combinations thereof. In some embodiments, the silicide layers 119a and 119b are formed by performing a self-aligned silicide (salicide) process including following steps. A metal layer is formed to at least cover the S/D regions 118a and 118b. The material of the metal layer may include Ti, Co, Ni, NiCo, Pt, Ni(Pt), Ir, Pt(Ir), Er, Yb, Pd, Rh, Nb, TiSiN, or combinations thereof. Thereafter, an annealing process is carried out such that the metal layer is reacted with the S/D regions 118a and 118b, so as to form the silicide layers 119a and 119b. The unreacted metal layer is then removed.

Figure 11:
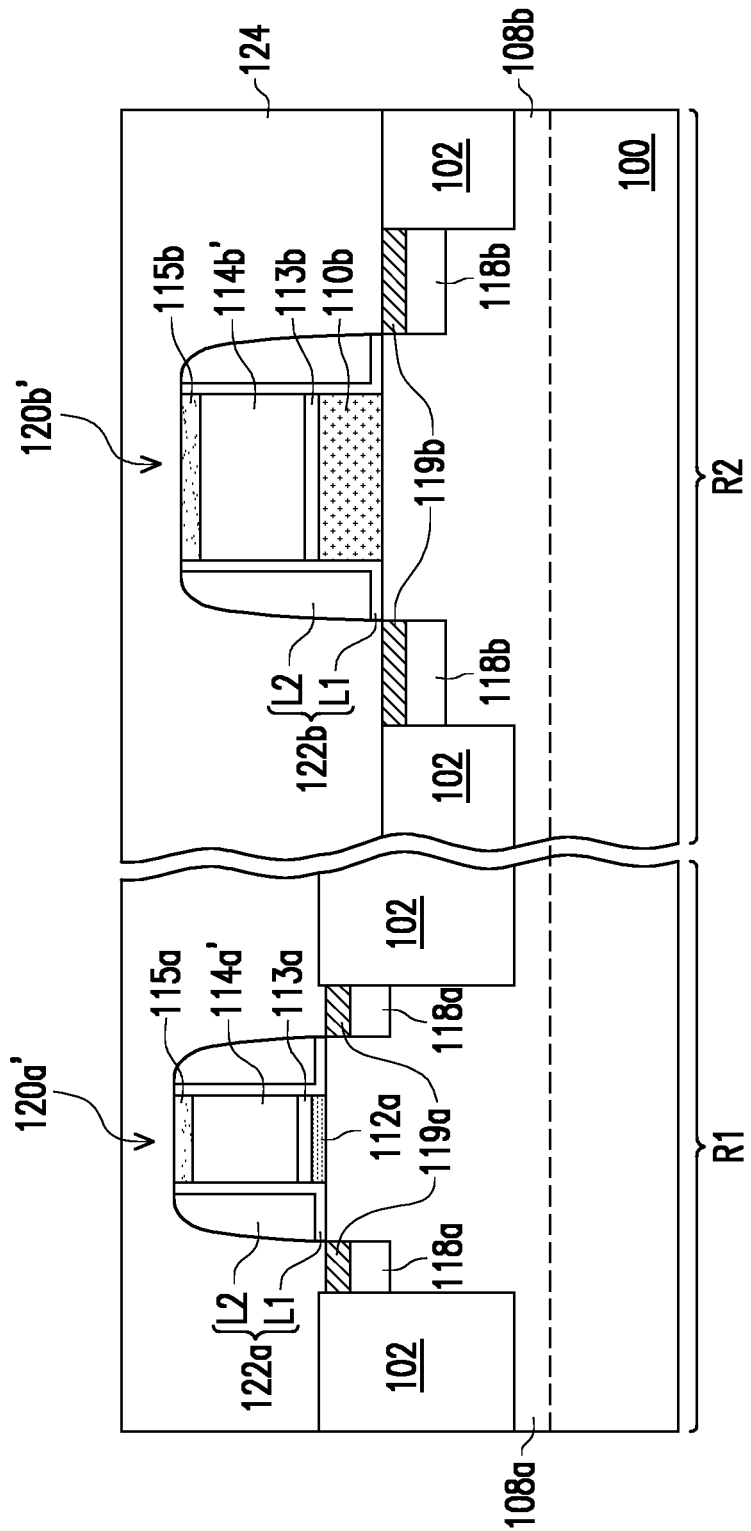
Figure 12:
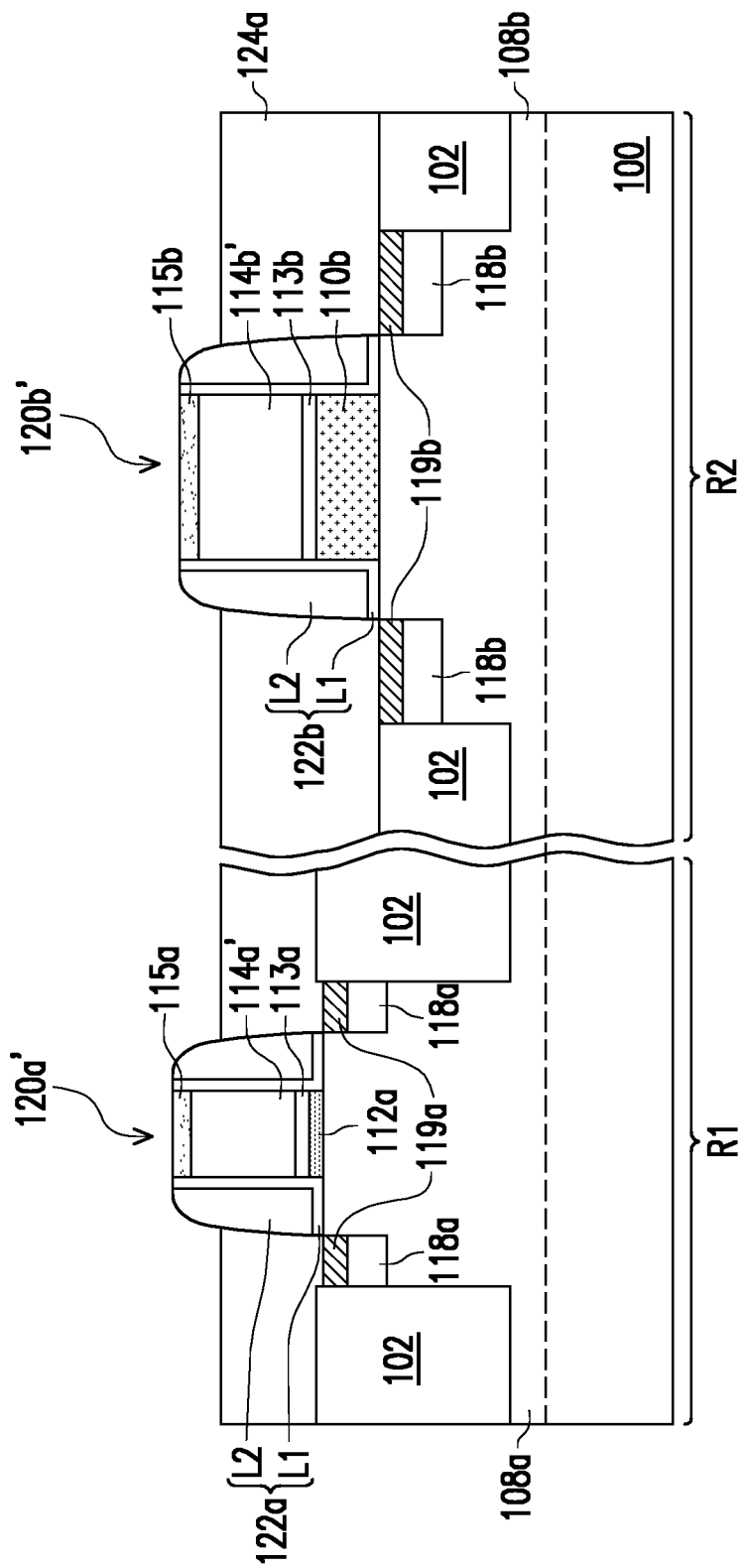

Referring to FIG. 11, a mask layer 124 is formed on the substrate 100 to cover the stack structures 120a' and 120b' and spacers 122a and 122b. The mask layer 124 may include photoresist formed by spin coating process. Referring to FIG. 11 to FIG. 12, a portion of the mask layer 124 is removed to expose upper portions of the stacked structures 120a', 120b' and spacers 122a, 122b. The mask layer 124 may be removed by an etching back process, for example. In some embodiments, at least the hard masks 115a and 115b and spacers 122a and 122b on sidewalls thereof are exposed by the remained mask layers 124a. The remained mask layer 124a may have a top surface lower than top surfaces of the dummy gates 122a and 122b.

Figure 13:
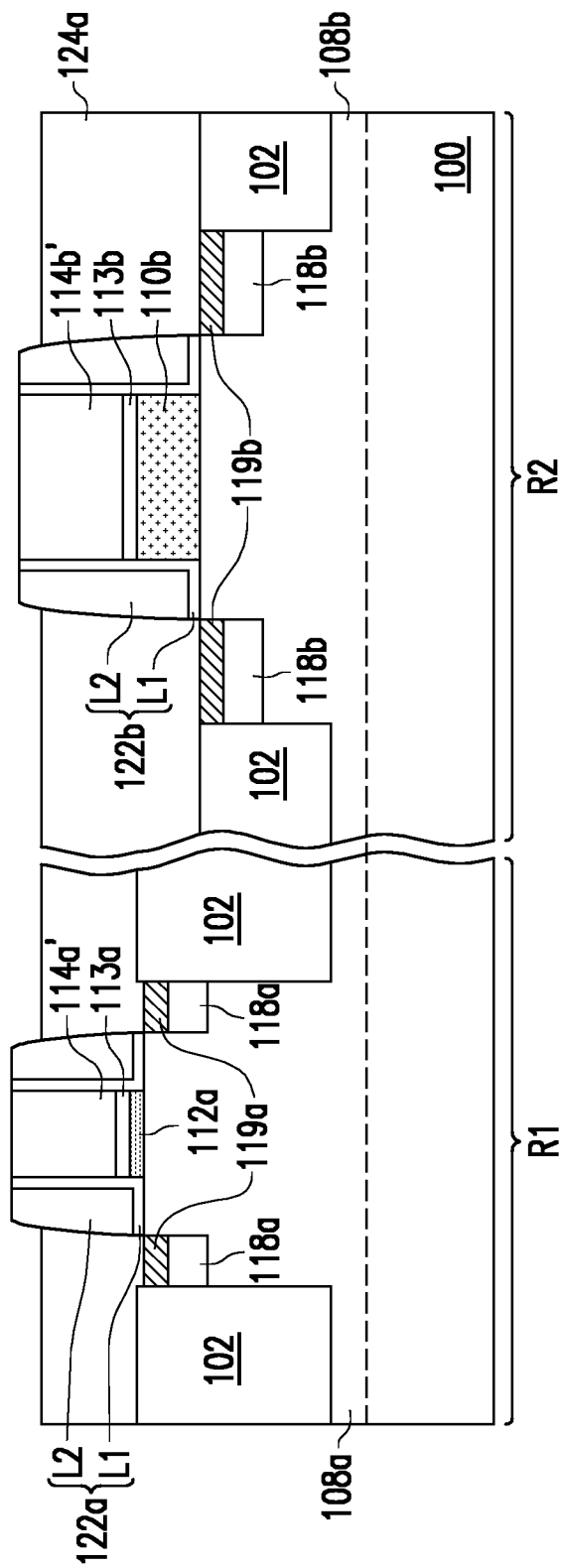
Figure 14:
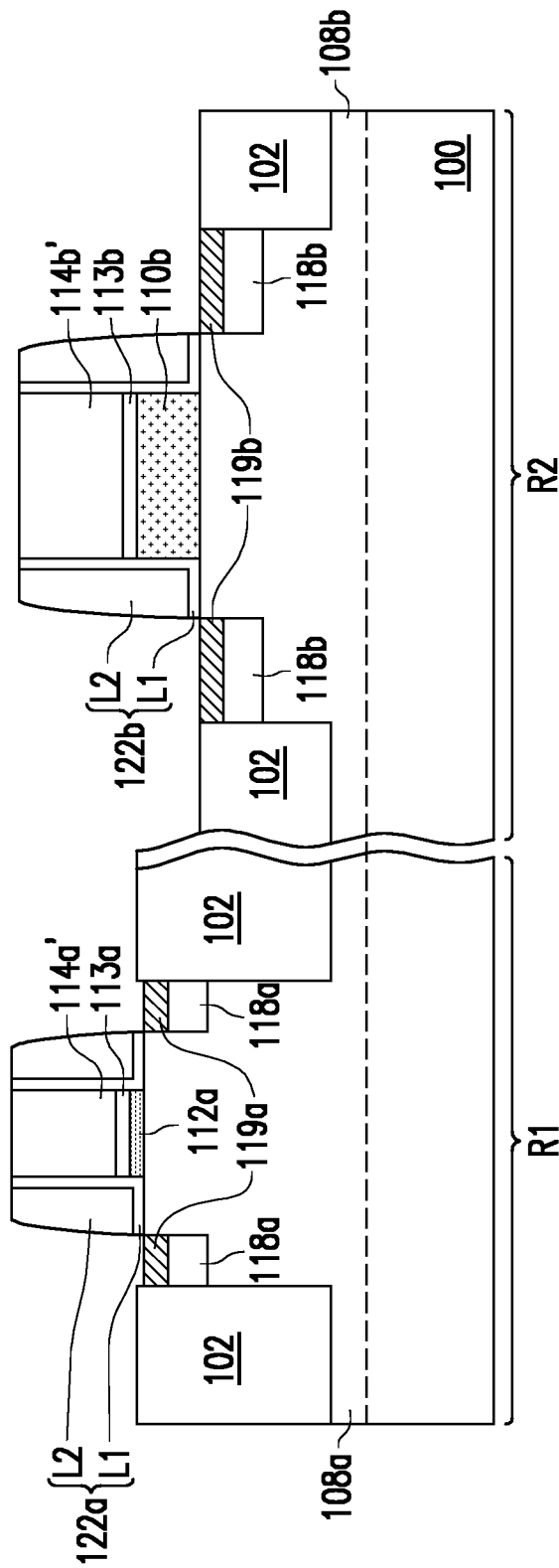

Referring to FIG. 12 and FIG. 13, the hard masks 115a and 115b and portions of the spacers 122a and 122b on sidewalls thereof are removed by an etching process using the mask layer 124a as an etching mask, such that the dummy gates 114a' and 114b' are exposed. The etching process may include wet etching, dry etching or a combination thereof. Referring to FIG. 13 to FIG. 14, the mask layer 124a is then removed by a stripping process or an ashing process.

Figure 15:
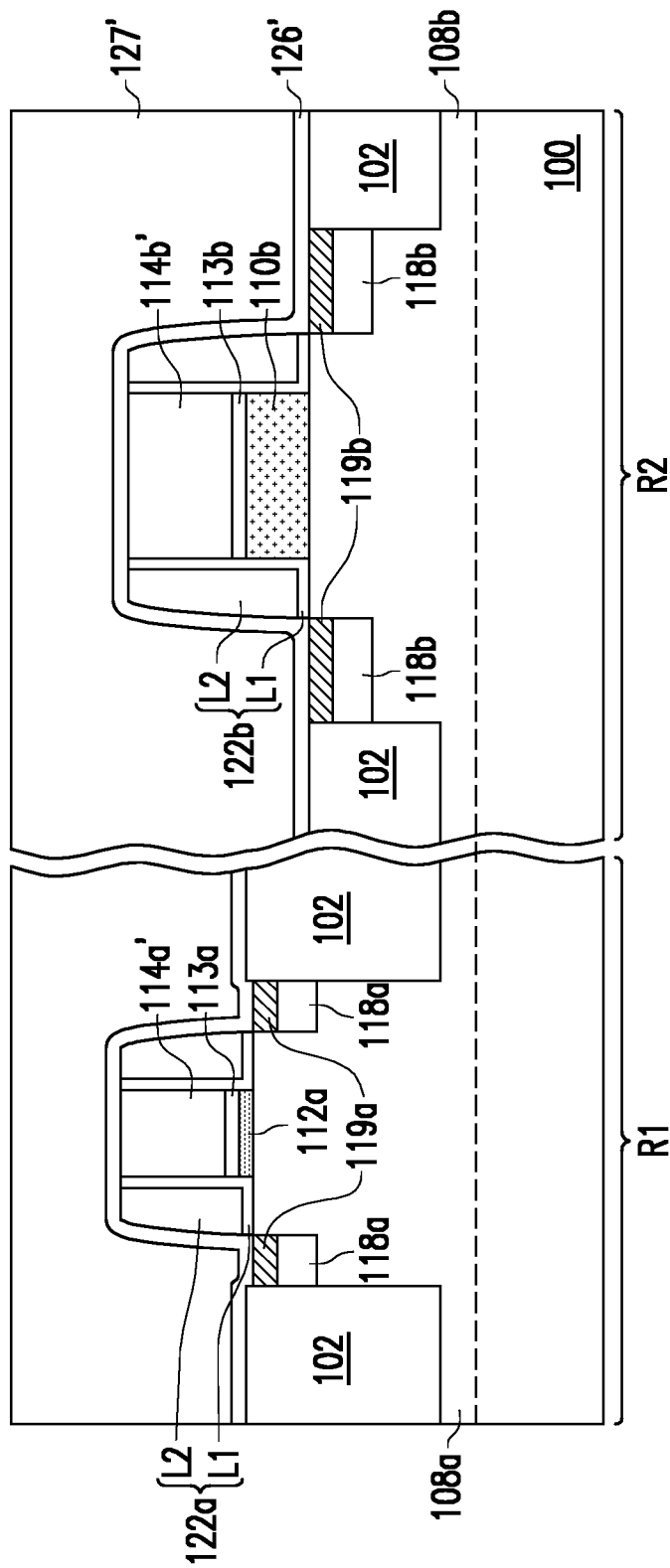

Referring to FIG. 15, an etching stop material layer 126' is formed over the substrate 100 to cover the dummy gate 114a', 114b' and spacers 122a, 122b. In some embodiments, the etching stop layer 126' includes SiN, SiC, SiOC, SiON, SiCN, SiOCN, or the like, or combinations thereof. The etching stop layer 126' may be formed by atomic layer deposition (ALD), CVD, plasma-enhanced CVD (PECVD), flowable CVD (FCVD), or the like.

A dielectric material layer 127' is formed on the etching stop material layer 126'. The dielectric material layer 127' includes a material different from that of the etching stop material layer 126'. In some embodiments, the dielectric material layer 127' includes silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 127' may include low-k dielectric material with a dielectric constant lower than 4, extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The dielectric material layer 127' may be a single layer structure or a multi-layer structure. The dielectric material layer 127' may be formed by CVD, PECVD, FCVD, spin coating or the like or combinations thereof.

Figure 16:
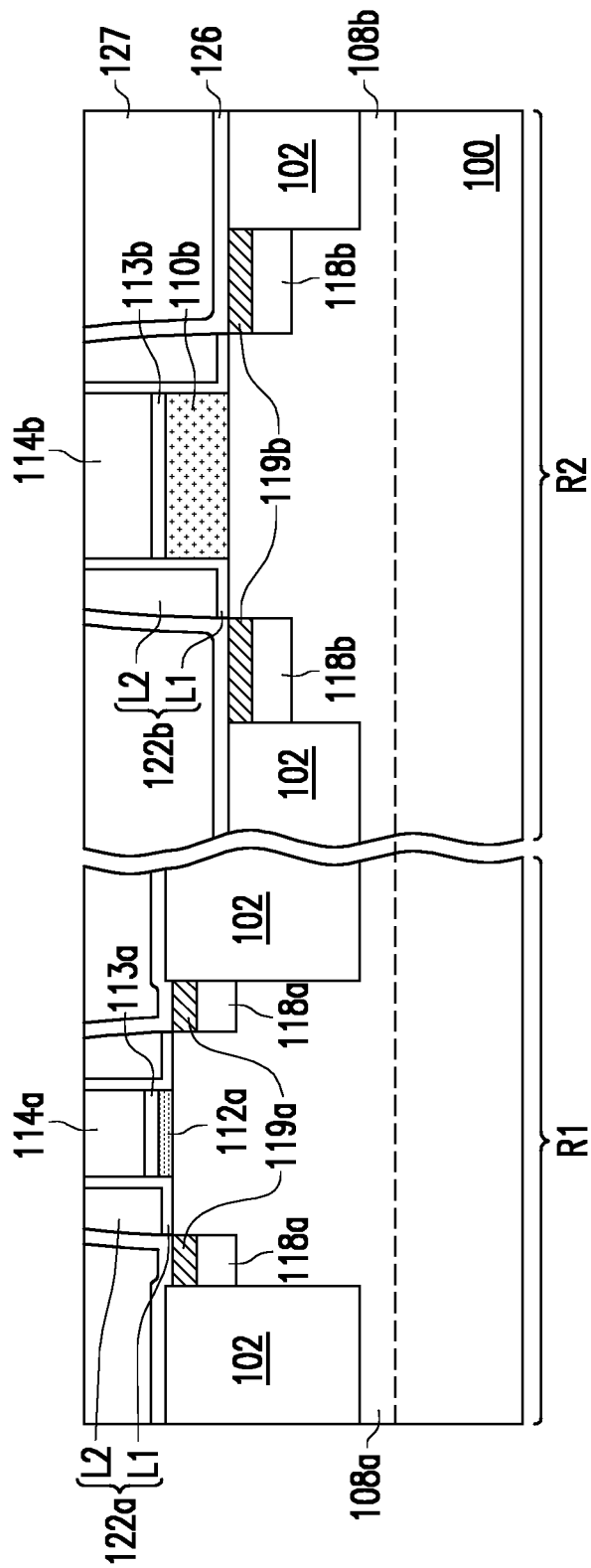

Referring to FIG. 15 and FIG. 16, a planarization process is performed to remove portions of the dielectric material layer 127' and the etching stop material layer 126', portions of the dummy gates 114a', 114b' and portions of the spacers 122a, 122b, so as to form dummy gates 114a, 114b, and an etching stop layer 126 and a dielectric layer 127 are laterally aside the dummy gates 114a, 114b. In some embodiments, after the planarization process is performed, the top surfaces of the dummy gates 114a and 114b are exposed, and may be substantially coplanar with the top surfaces of the spacers 122a, 122b, the top surface of the dielectric layer 127 and the top surface of the etching stop layer 126. The planarization process may include a chemical mechanical polishing (CMP) process.

Figure 17:
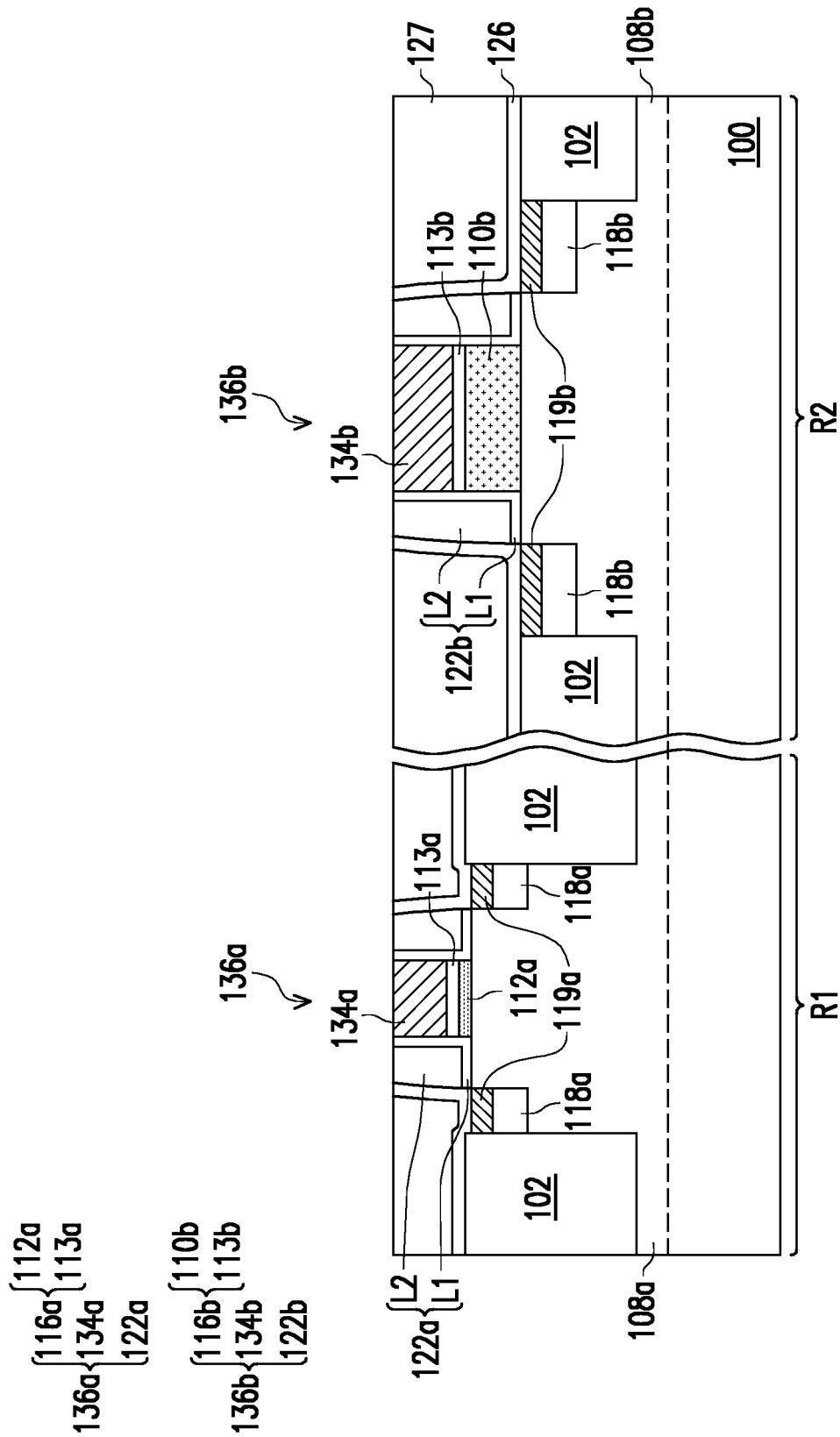

Referring to FIG. 16 and FIG. 17, gate replacement process(es) may be performed to replace the dummy gates 114a, 114b with metal-containing gate electrode 134a, 134b. The dummy gates 114a and 114b may be replaced successively or simultaneously. In some embodiments, the gate electrode 134a, 134b may respectively include a work function metal layer and a fill metal layer on the work function metal layer. The materials of the gate electrodes 134a and 134b may be the same or different. The work function metal layer may be an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The fill metal layer includes copper, aluminum, tungsten, or other suitable metallic materials. In some embodiments, the gate electrode 134a/134b may further include a liner layer, an interface layer, a seed layer, an adhesion layer, a barrier layer, a combination thereof or the like.

The gate replacement process may include the following processes. The dummy gates 114a and 114b are removed by an etching process, so as to form a first trench between the spacers 122a, and a second trench between the spacers 122b. Thereafter, gate electrode materials (e.g., work function material and fill metal material) are formed over the substrate 100 by suitable processes such as ALD, CVD, physical vapor depositon (PVD), plating process, or combinations thereof. The gate electrode materials fill into the first and second trenches and cover the top surface of the dielectric layer 127. Thereafter, a planarization process may be performed to remove excess portions of the gate electrode materials over the top surface of the dielectric layer 127, and the gate electrode materials remained in the first and second trenches form the gate electrodes 134a and 134b. In some embodiments, the top surfaces of the gate electrode 134a and 134b are substantially coplanar with the top surfaces of the dielectric layer 127, the etching stop layer 126, and the spacers 122a, 122b. It is noted that, in the above-described replacement process, the dummy gates 114a and 114b are replaced simultaneously, which is merely for illustration, and the disclosure is not limited thereto. In alternative embodiments, the gate replacement processes for the dummy gates 114a and 114b may be performed separately.

Still referring to FIG. 17, the interfacial layer 112a, the high-k dielectric layer 113a, the gate electrode 134a and the spacers 122a constitute a gate structure 136a. The spacer 122a covers the sidewalls of the interfacial layer112a, the high-k dielectric layer 113a, and the gate electrode 134a. The combination of the interfacial layer 112a and the high-k dielectric layer 113a may be referred to as a gate dielectric layer 116a of the gate structure 136a. The gate oxide layer 110b, the high-k dielectric layer 113b, the gate electrode 134b and the spacers 122b constitute a gate structure 136b. The spacer 122b covers the sidewalls of the gate oxide layer 110b, the high-k dielectric layer 113b, and the gate electrode 134b. The combination of the gate oxide layer 110b and the high-k dielectric layer 113b may be referred to as a gate dielectric layer 116b of the gate structure 136b. The thickness of the gate dielectric layer 116b is larger than the thickness of the gate dielectric layer 116a.

The etching stop layer 126 and the dielectric layer 127 are laterally aside the gate structures 136a and 136b. In some embodiments, the etching stop layer 126 may be referred to as a contact etch stop layer (CESL), and the dielectric layer 127 may be referred to as an interlayer dielectric layer (ILD) or ILD0.

Figure 18:
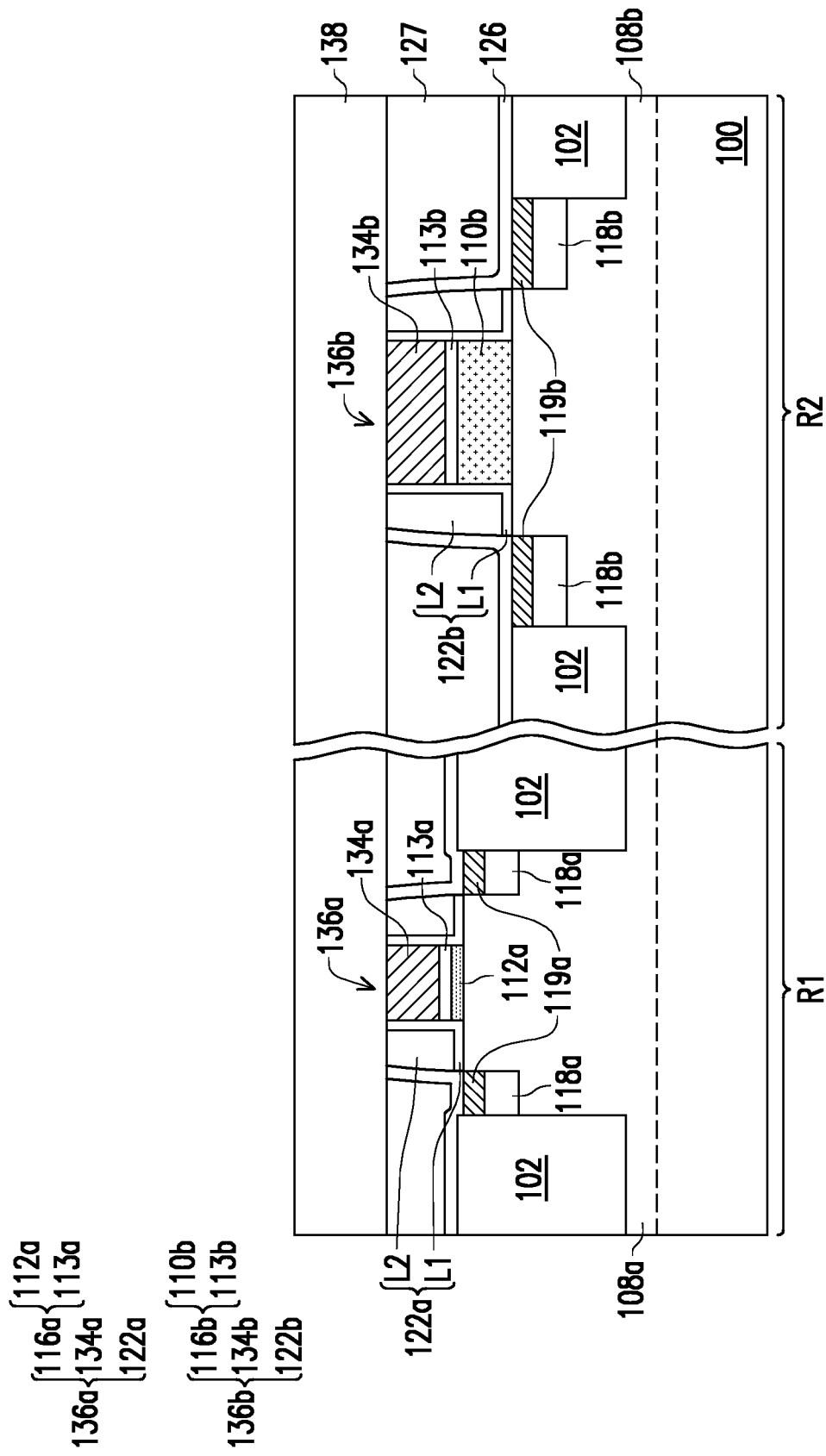

Referring to FIG. 18, a dielectric layer 138 is formed on the gate structures 136a and 136b and the dielectric layer 127. The material and forming method of the dielectric layer 138 may be similar to those of the dielectric layer 127. The dielectric layer 138 may also be referred to as ILD1.

Figure 19:
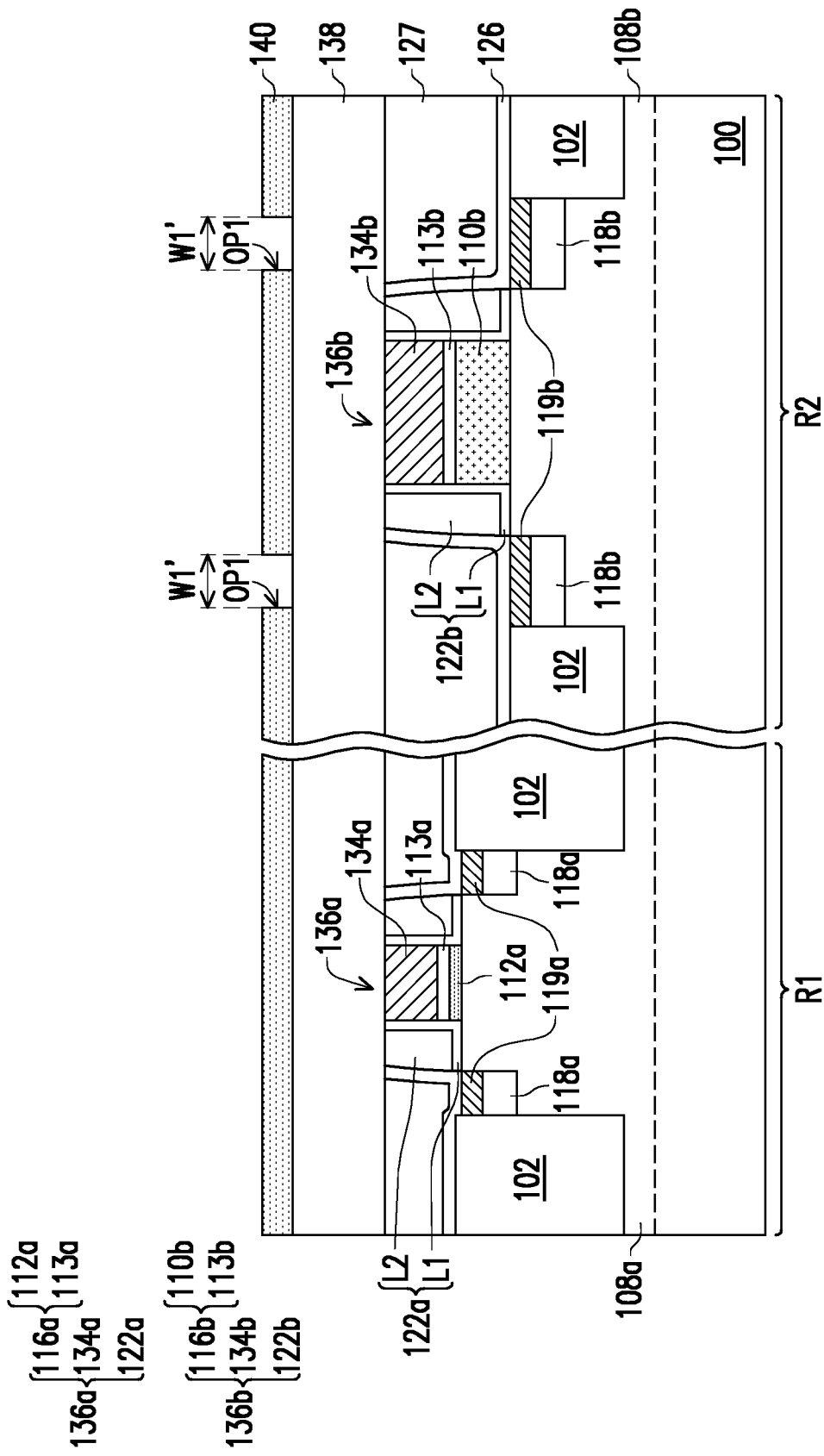

Referring to FIG. 19, a patterned mask layer 140 for defining contact holes in the second region R2 is formed over the substrate 100. The patterned mask layer 140 may include patterned photoresist. In some embodiments, the patterned mask layer 140 covers the first region R1 and has openings OP1 exposing portions of the top surface of the dielectric layer 138 in the second region R2. The openings OP1 are disposed directly over the S/D regions 118b and used for defining S/D contact holes on the S/D regions 118b.

Figure 20:
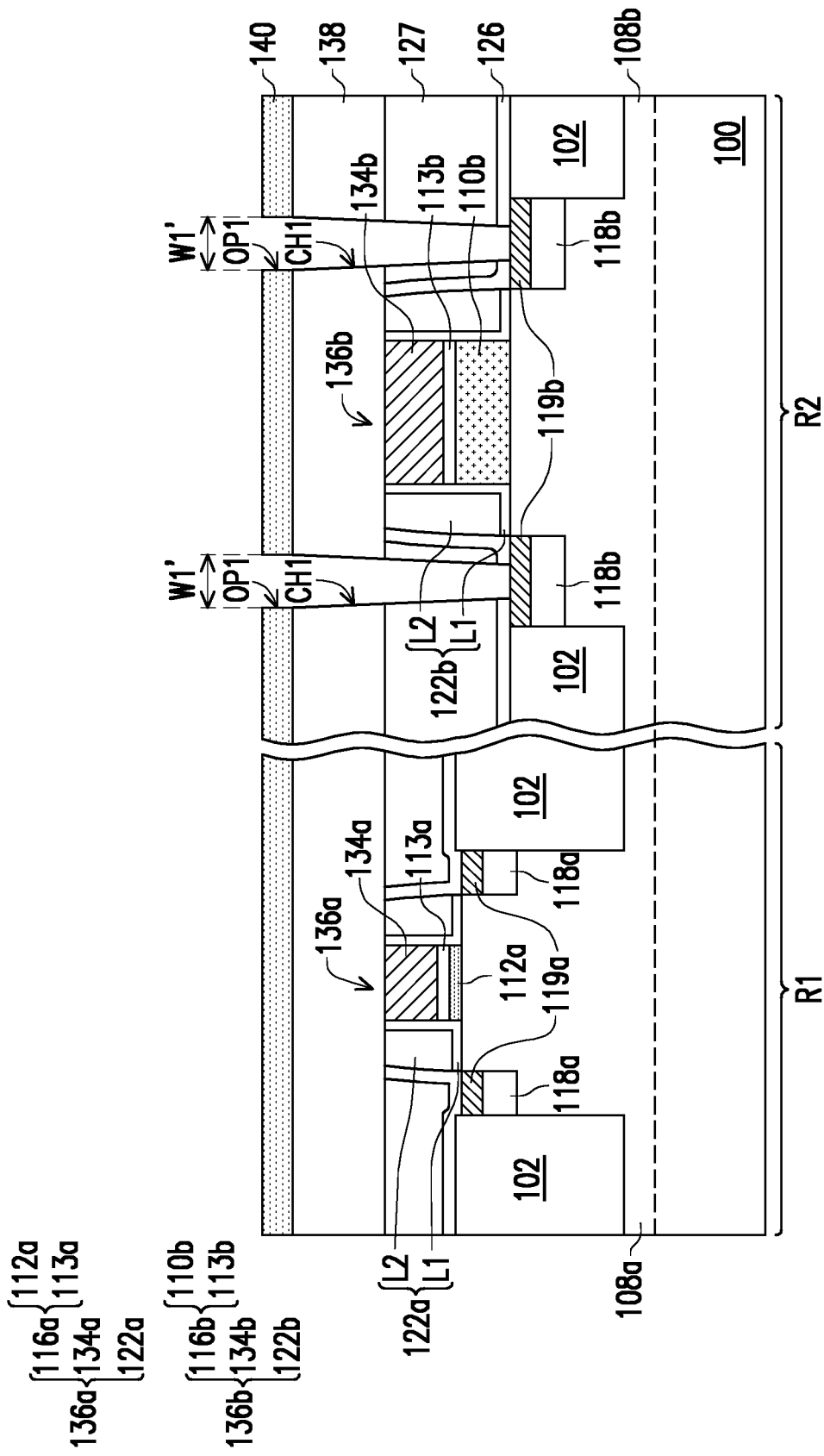

Referring to FIG. 20, portions of the dielectric layers 138, 127 and the etching stop layer 126 are removed by etching process(es) using the patterned mask layer 140 as an etching mask, so as to form S/D contact holes CH1 exposing portions of the S/D regions 118b (e.g. silicide layers 119b). In some embodiments, the contact holes CH1 are tapered from top to bottom, but the disclosure is not limited thereto. In alternative embodiments, the contact hole CH1 may have uniform width from top to bottom.

Figure 21:
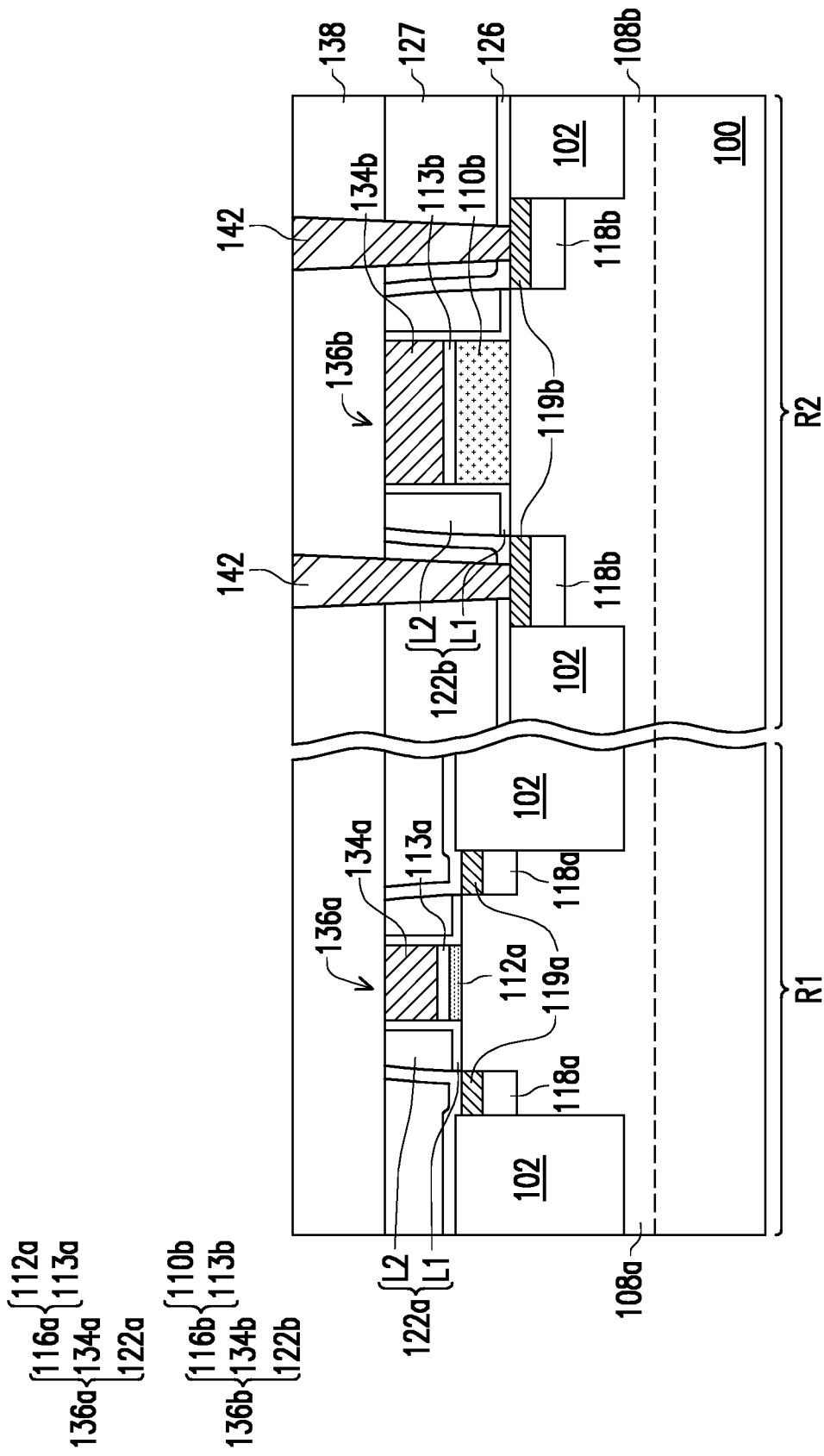

Referring to FIG. 21, the patterned mask layer 140 is removed by, for example, a stripping process or an ashing process. Thereafter, S/D contacts 142 are formed in the contact hole CH1 to electrically connect to the S/D regions 118b. In some embodiments, the contact 142 includes a barrier layer (not shown) and a conductive layer (not shown) on the barrier layer. The barrier layer may surround sidewalls and/or bottom surface of the conductive layer. The barrier layer may include titanium, tantalum, titanium nitride, tantalum nitride, manganese nitride or combinations thereof. The conductive layer may include metal, such as tungsten (W), copper (Cu), Ru, Ir, Ni, Os, Rh, Al, Mo, Co, alloys thereof, combinations thereof or any metallic material with suitable resistance and gap-fill capability. The contacts 142 may be formed by the following processes: a barrier material layer and a conductive material layer are formed on the dielectric layer 138 to fill the contact holes CH1; thereafter, a planarization process is performed to remove excess portions of the barrier material layer and the conductive material layer over the top surface of the dielectric layer 138, and the remained barrier layer and conductive layer in the contact holes CH1 constitute the contacts 142. In some embodiments, the top surfaces of the contacts 142 are substantially coplanar with the top surface of the dielectric layer 138.

Figure 22A:
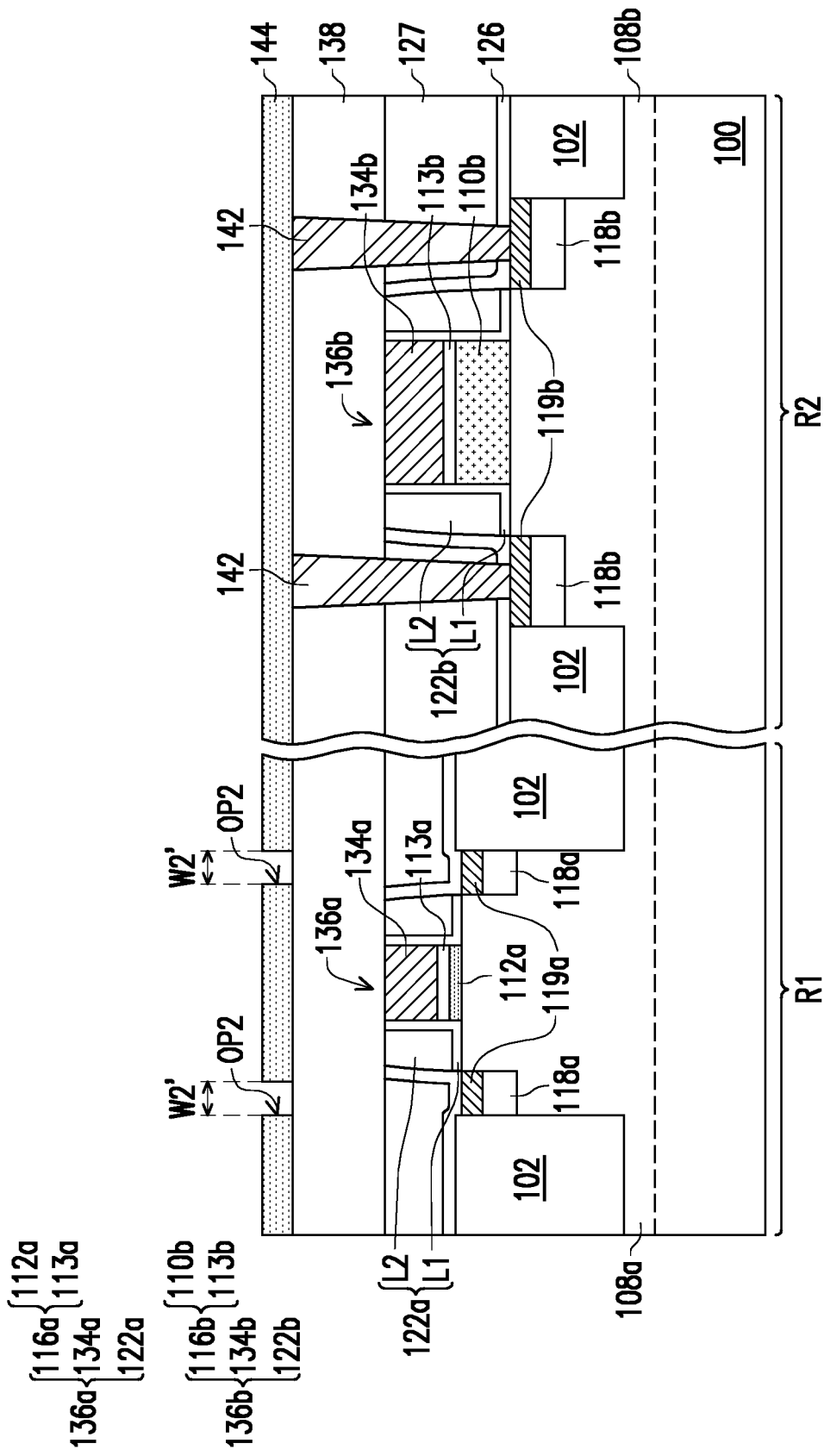
Figure 22B:
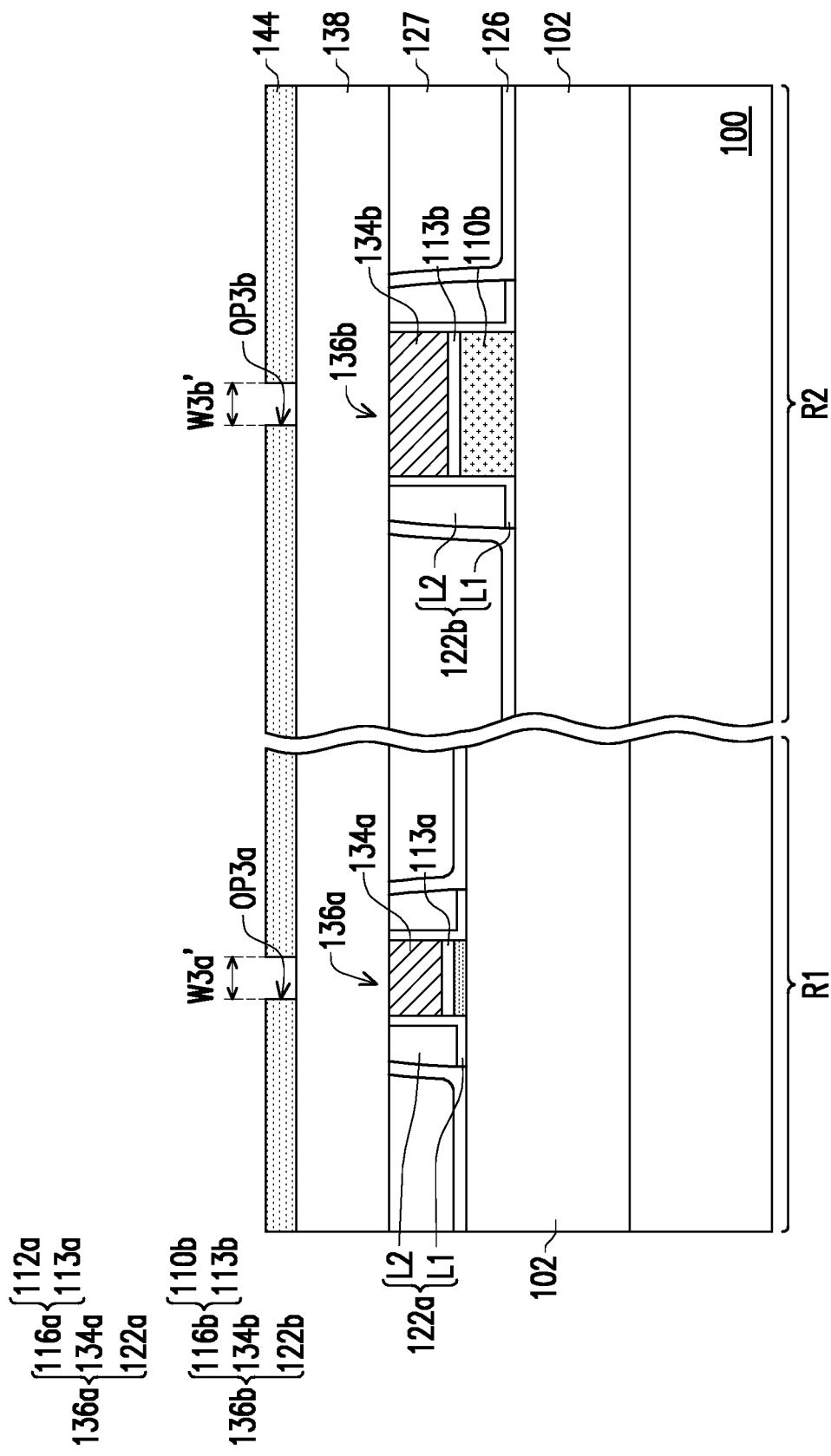
Figure 23A:
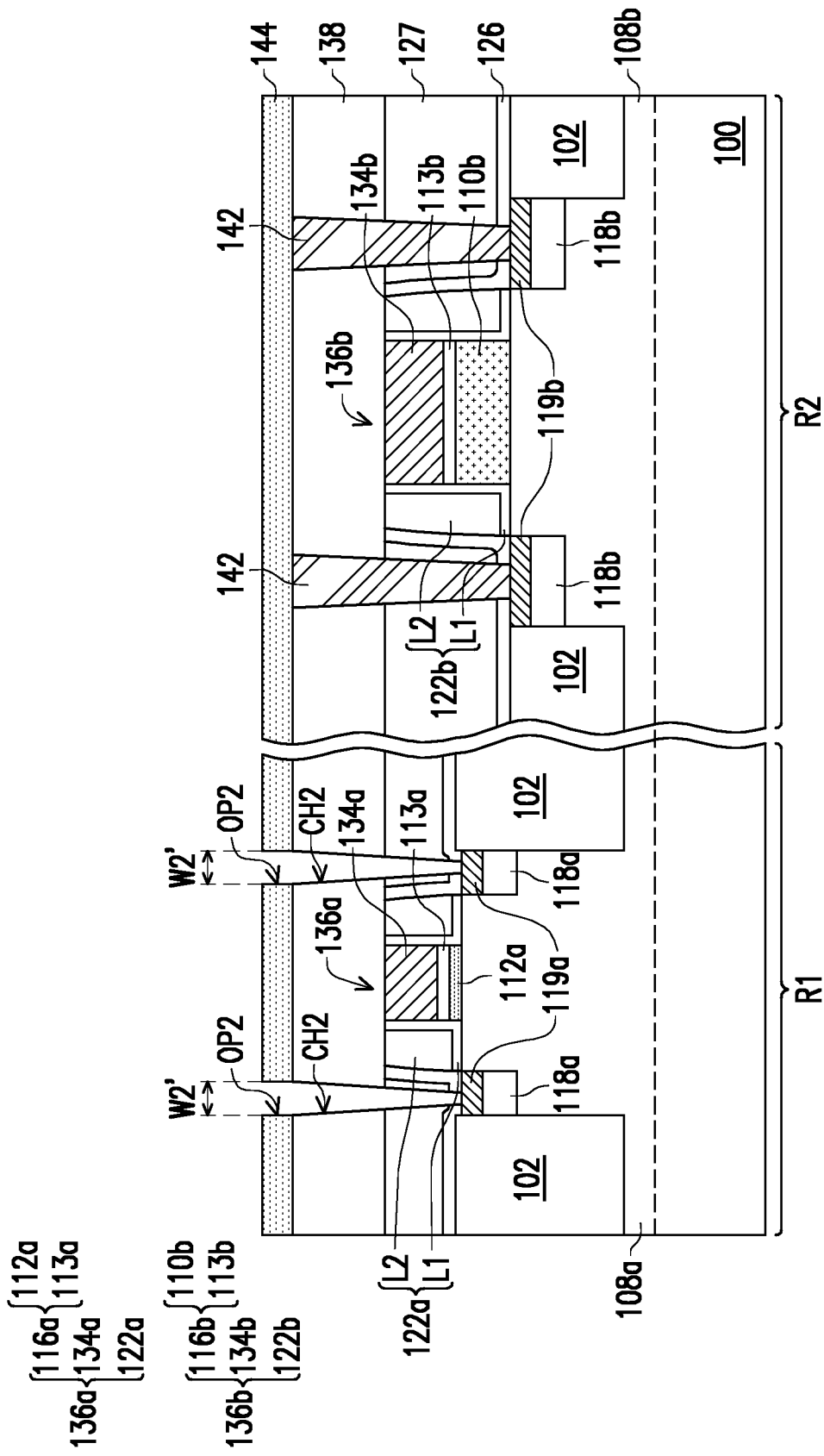
Figure 23B:
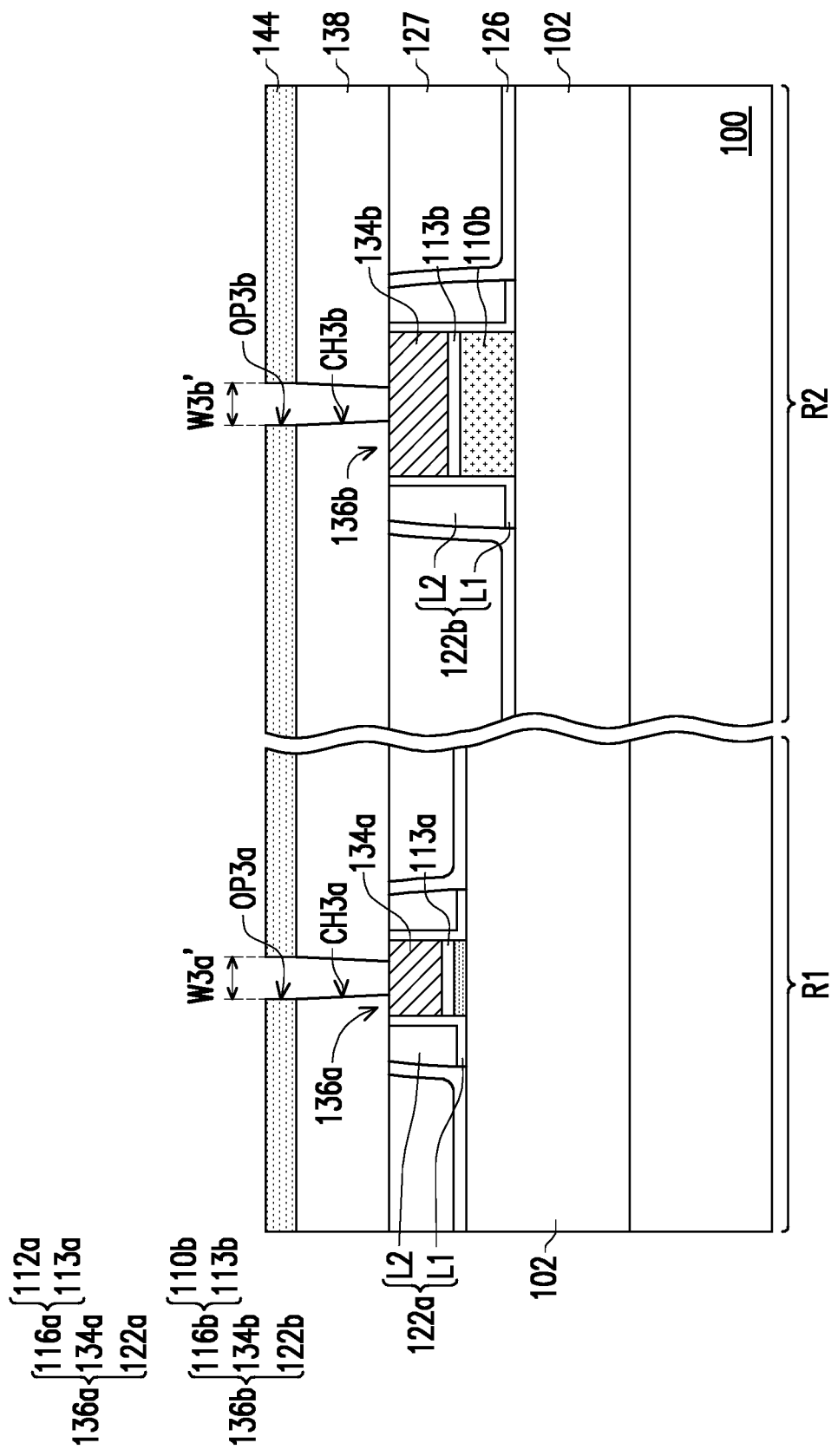
Figure 24A:
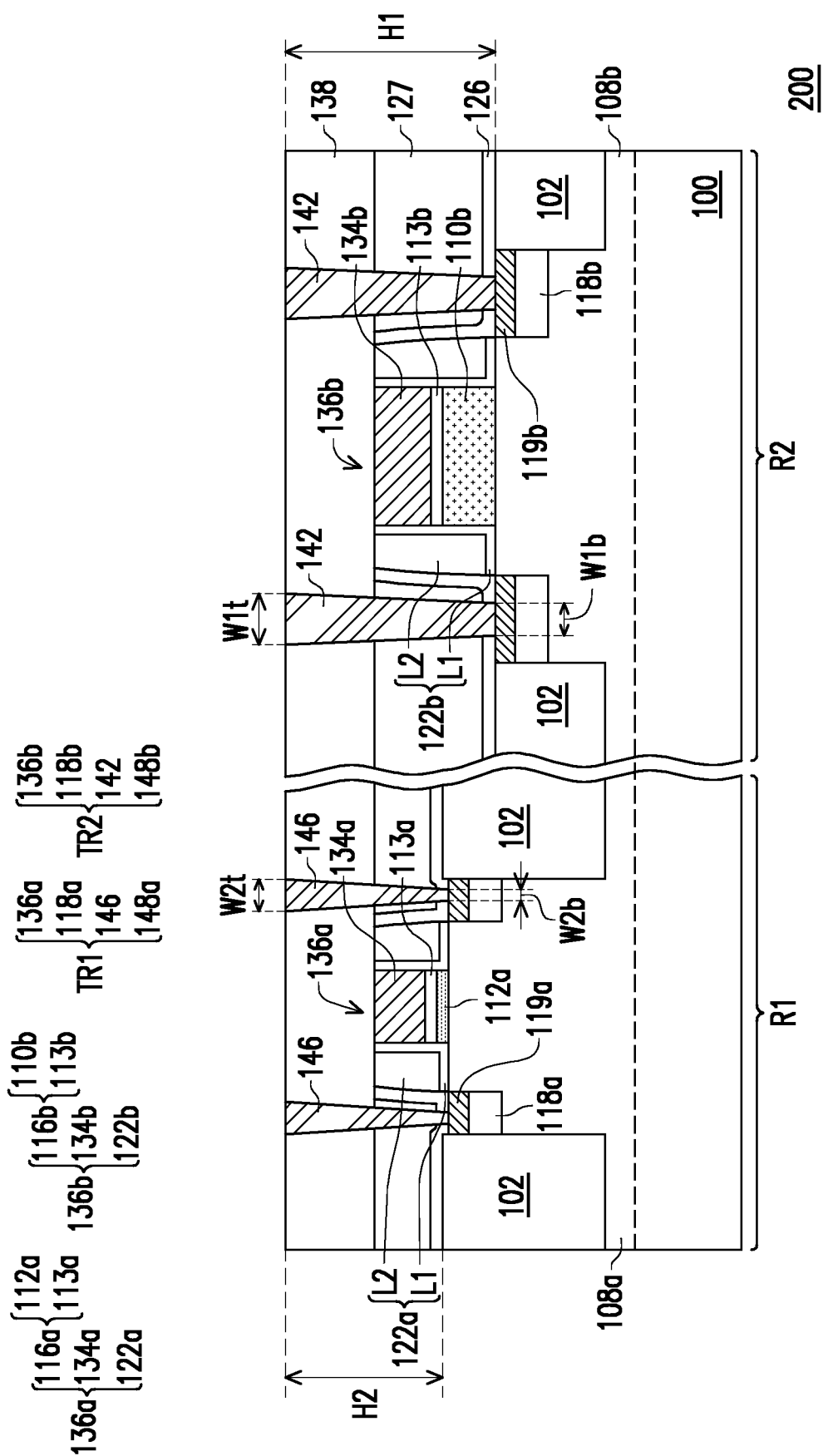
Figure 24B:
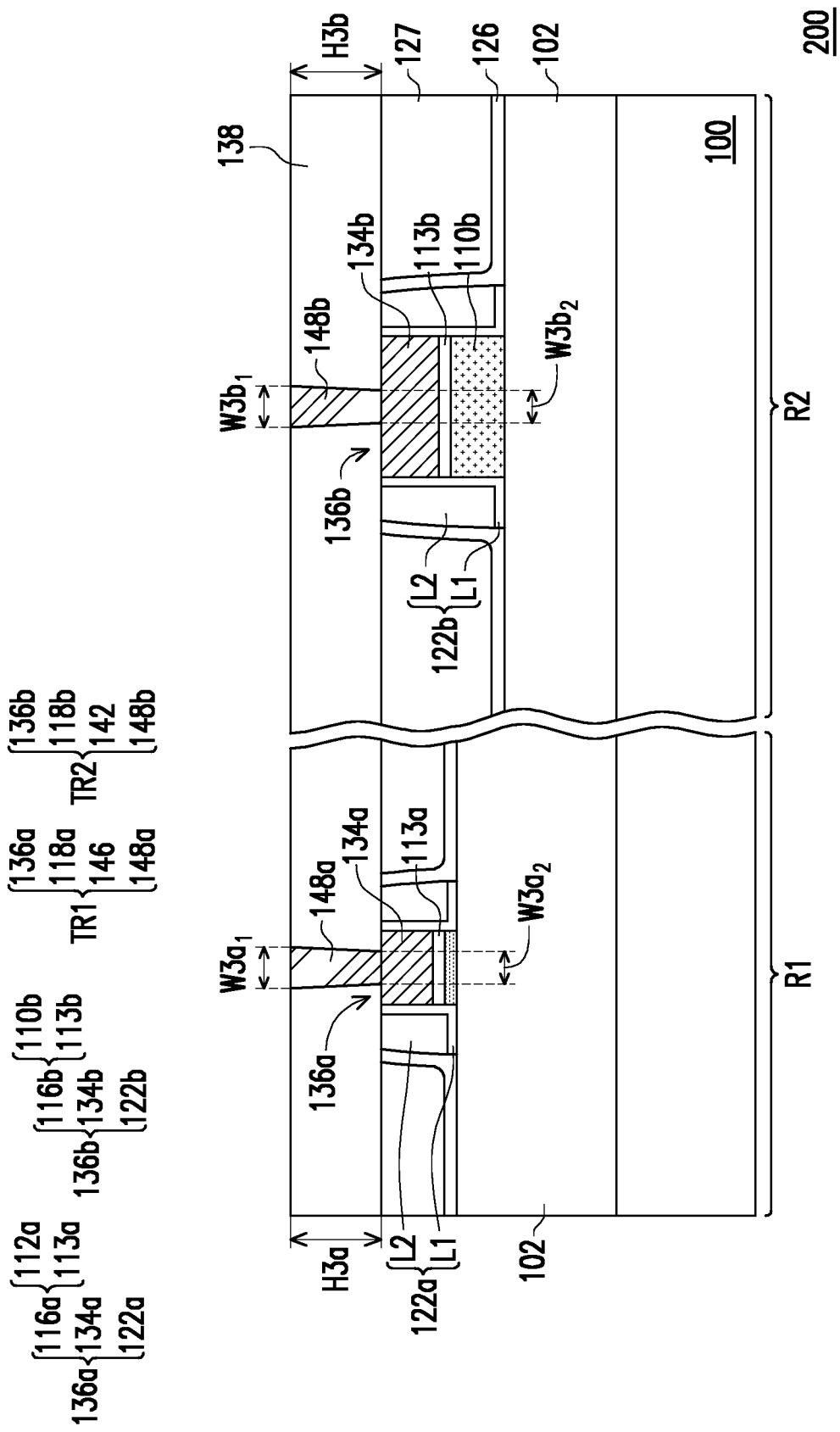

FIG. 22A to FIG. 24A and FIG. 22B to FIG. 24B illustrates the formation of S/D contacts in the first region R1 and the gate contacts in the first and second regions R1 and R2. FIG. 22A to FIG. 24A and FIG. 22B to FIG. 24B illustrate cross-sections taken along different lines during the manufacturing process, wherein FIG. 22A and FIG. 22B illustrates cross-sectional views taken along different lines in a same manufacturing stage, FIG. 23A and FIG. 23B illustrates cross-sectional views taken along different lines in a same manufacturing stage, FIG. 24A and FIG. 24B illustrates cross-sectional views taken along different lines in a same manufacturing stage.

FIG. 22A to FIG. 24A are cross-sectional views showing the formation of S/D contacts in the first reign, while FIG. 22B to FIG. 24B are cross-sectional views showing the formation of gate contacts. In some embodiments, the gate structures 136a and 136b may extend in a direction perpendicular to the paper and across active regions and isolation structures. In some embodiments, the S/D contacts and gate contacts may be offset from each other in the direction perpendicular to the extending direction of the gate structures 136a and 136b. For example, the S/D contacts are directly over the S/D regions in active regions, while gate contacts may be disposed on gate structure directly over isolation structures. The details are described as below. However, the disclosure is not limited thereto.

Referring to FIG. 22A and FIG. 22B, after the S/D contacts 142 are formed in the second region R2, a patterned mask layer 144 is formed on the dielectric layer 138 and the contacts 142. The patterned mask layer 144 is configured for defining S/D contact holes in the first region R1, and gate contact holes in both of the first region R1 and second region R2. The patterned mask layer 144 may include patterned photoresist. In some embodiments, the patterned mask layer 144 includes openings OP2 and openings OP3a and OP3b exposing portions of the top surface of the dielectric layer 138. The openings OP2 are disposed directly over the S/D regions 118a for defining S/D contact holes in the first region R1. The openings OP3a and OP3b are disposed directly over the gate electrodes 134a and 134b for defining gate contact hole in the first and second region R1 and R2. In some embodiments, the width W2' of the opening OP2 (for defining S/D contact holes in the first region R1) is less than the width W1' of the opening OP1 (for defining S/D contact holes in the second region R2, shown in FIG. 20); the width W3a' of the opening OP3a (for defining gate contact hole in the first region R1) may be substantially equal to or different from the width W3b' of the opening OP3b (for defining gate contact hole in the second region R2). In some embodiments, the width W3a' and width W3b' may be substantially equal to or different from the width W2'.

Referring to FIG. 23A and FIG. 23B, a patterning process using the patterned mask layer 144 as a mask is performed, so as to form S/D contact holes CH2 on the S/D regions 118a, a gate contact hole CH3a on the gate electrode 134a and a gate contact hole CH3b on the gate electrode 134b. The patterning process includes performing etching process (es) using the patterned mask layer 144 as an etching mask, such that portions of the dielectric layers 138, 127 and the etching stop layer 126 exposed by the openings OP2 are removed to form S/D contact holes CH2, and portions of the dielectric layer 138 exposed by the openings OP3a and OP3b are removed to form gate contact holes CH3a and CH3b. In some embodiments, the contact holes CH2, CH3a and CH3b may be tapered from top to bottom. In alternative embodiments, the contact holes CH2, CH3a and CH3b may have uniform width, respectively.

Referring to FIG. 24A and FIG. 24B, the patterned mask layer 144 is then removed by a stripping or an ashing process. Thereafter, S/D contacts 146 are formed in the contact holes CH2 to connect to the S/D regions 118a, and gate contacts 148a and 148b are formed in the contact holes CH3a and CH3b to connect to the gate electrodes 134a and 134b. The contacts 146, 148a and 148b may respectively include a barrier layer and a conductive layer on the barrier layer (not shown). The materials of the barrier layer and conductive layer are selected from the same candidate materials of the contacts 142. The contacts 146, 148a and 148b may be formed by the following processes: a barrier material layer and a conductive material layer are formed on the dielectric layer 138 and fill into the contact holes CH2, CH3a and CH3b; a planarization process is then performed to remove excess portions of the barrier material layer and the conductive material layer over the top surface of the dielectric layer 138, such that barrier layers and conductive layers are remained in the contact holes CH2, CH3a, CH3b to constitute the contacts 146, 148a and 148b. In some embodiments, the top surfaces of the contacts 146, 148a and 148b are substantially coplanar with the top surface of the dielectric layer 138 and the top surface of the contact 142.

In the present embodiments, the S/D contacts 146 in the first region R1 and the gate contacts 148a and 148b in the first and second regions R1/R2 are formed simultaneously and formed after the formation of S/D contacts 142 in the second region R2. In some embodiments, the materials of the S/D contacts 146 and the gate contacts 148a, 148b are the same as each other and may be the same as the material of the contacts 142. In alternative embodiments, the materials of the S/D contacts 146 and the gate contacts 148a, 148b are the same as each other and different from the material of the contacts 142.

Referring to FIG. 24A and FIG. 24B, the gate structure 136a, the S/D regions 118a, the S/D contact 146, and the gate contact 148a constitute a first transistor device TR1. The gate structure 136b, the S/D regions 118b, the S/D contacts 142 and the gate contact 148b constitute a second transistor device TR2. The first and second transistor devices TR1 and TR2 may be MOSFET or FinFET devices. In some embodiments, the first transistor device TR1 is a low voltage transistor device TR1 disposed in the low voltage device region R1 and configured to operate at a low operation voltage, the second transistor device TR2 is a high voltage transistor device disposed in the high voltage device region R2 and configured to operate at a high operation voltage.

A semiconductor device 200 is thus formed, the semiconductor device 200 includes the first transistor device TR1 disposed in the first region R1 and the second transistor device TR2 in the second region R2. The substrate 100 in the second region R2 is recessed, and a portion of the high voltage transistor device TR2 is located in the recess of the substrate 100. In other words, a portion of the high voltage transistor device TR2 is embedded in the substrate 100.

In some embodiments, the gate structure 136a includes the gate dielectric layer 116a (i.e. the interfacial layer 112a and the high-k dielectric layer 113a), the gate electrode 134a and the spacers 122a. The gate structure 136b includes the gate dielectric layer 116b (i.e. the gate oxide layer 110b and the high-k dielectric layer 113b), the gate electrode 134b and the spacers 122b. The size (or dimension) of the gate structure 136b may be larger than the size (or dimension) of the gate structure 136a. For example, the width of the gate structure 136b may be larger than the width of the gate structure 136a. The height of the gate structure 136b is larger than the height of the gate structure 136a.

In some embodiments, the bottom surface of the gate structure 136b (i.e. the bottom surfaces of the gate dielectric layer 110b and the spacers 122b) is lower than the bottom surface of the gate structure 136a (i.e. the bottom surfaces of the interfacial layer 112a and the spacers 122a); the top surface of the gate structure 136b (i.e. the top surfaces of the gate electrode 134b and the spacers 122b) may be substantially coplanar with the top surface of the gate structure 136a (i.e. the top surfaces of the gate electrode 134a and the spacers 122*a*). The thickness of the gate dielectric layer 116*b* is larger than the thickness of the gate dielectric layer 116*a*. In some embodiments, the thicknesses of the high-k dielectric layer 113*a* and 113*b* may be the same, and the gate oxide layer 110*b* is thicker than the interfacial layer 112*a*. The top surface of the gate oxide layer 110*b* may be substantially coplanar with or slightly higher than the top surface of the substrate 100 in the first region R1. The height of the gate electrode 134*b* may be less than the height of the gate electrode 134*a*.

The S/D contacts 146 penetrates through the dielectric layers 138, 127 and the etching stop layer 126 to connect to the S/D regions 118*a*. In some embodiments, the S/D regions 118*a* have silicide layers 119*a* formed thereon, and the S/D contacts 146 are landing on the silicide layers 119*a* of the S/D regions 118*a*. The S/D contacts 142 penetrates through the dielectric layers 138, 127 and the etching stop layer 126 to connect to the S/D regions 118*b*. In some embodiments, the S/D regions 118*b* have silicide layers 119*b* formed thereon, and the S/D contacts 142 are landing on the silicide layers 119*b* of the S/D regions 118*b*.

In some embodiments, the size (e.g. height, width) of the contact 142 is larger than the size (e.g. height, width) of the contact 146. Since the substrate 100 in the second region R2 is recessed, the S/D regions 118*b* of the second region R2 are located at a level height lower than the S/D region 118*a* of the first region R1, the height H1 of the S/D contact 142 is larger than the height H2 of the S/D contact 146. In some embodiments, the bottom surface of the contact 142 is lower than the bottom surface of the contact 146, and the top surface of the contact 142 may be substantially coplanar with the top surface of the contact 146.

The width of the S/D contact 142 may be larger than the width of the S/D contact 146. The sidewalls of the contacts 142 and 146 may be substantially straight or inclined, respectively. In some embodiments, both of the contacts 142 and 146 have inclined sidewalls and may be tapered toward the substrate 100. In other words, the widths of the contacts 142 and 146 decreases as approaching the substrate 100, respectively. The contact 142 has a top width W1*t* larger than its bottom width W1*b*. The contact 146 has a top width W2*t* larger than its bottom width W2*b*. In some embodiments, the top view of the contact may be circular shaped, and the width of the contact may correspond to or refer to the diameter of the contact when viewed in top view. However, the disclosure is not limited thereto, the contact may be any suitable shaped. In some embodiments, the width of the contact refers to the width/length of the contact along a direction perpendicular to the extending direction of the gate electrode.

In some embodiments, the top width W1*t* of the contact 142 is larger than the top width W2*t* of the contact 146, and the bottom width W1*b* of the contact 142 is larger than the bottom width W2*b* of the contact 146. In some embodiments, the area of the bottom surface (or referred to as bottom area) of the contact 142 is larger than the area of the bottom surface (or referred to as bottom area) of the contact 146. In some embodiments, the bottom area of the contact 142 is substantially equal to the contact area between the contact 142 and the corresponding S/D region 118*b*, the bottom area of the contact 146 is substantially equal to the contact area between the contact 146 and the corresponding S/D region 118*a*. In some embodiments, the contact area between the contact 142 and the corresponding S/D region 118*b* (e.g., the silicide layer 119*b* thereof) is larger than the contact area between the contact 146 and the corresponding S/D region 118*a* (e.g. the silicide layer 119*a* thereof). Accordingly, the S/D contact resistance of the high voltage transistor device TR2 is less than the S/D contact resistance of the low voltage transistor device TR1. In other words, the contact resistance between the contact 142 and the S/D region 118*b* is less than the contact resistance between the contact 146 and the S/D region 118*a*.

Referring to FIG. 24B, the gate contact 148*a* penetrates through the dielectric layer 138 to connect to the gate electrode 134*a* of the gate structure 136*a*, and the gate contact 148*b* penetrates through the dielectric layer 138 to connect to the gate electrode 134*b* of the gate structure 136*b*. In some embodiments, the size/dimension (e.g., height, width) of the gate contact 148*a* is substantially the same as the size/dimension (e.g., height, width) of the gate contact 148*b*. For example, the height H3*a* of the gate contact 148*a* may be substantially equal to the height H3*b* of the gate contact 148*b*.

The sidewalls of the contacts 148*a* and 148*b* may be substantially straight or inclined. In some embodiments, both of the contacts 148*a* and 148*b* have inclined sidewalls and may be tapered toward the corresponding gate electrodes 134*a* and 134*b*. In other words, the widths of the contacts 148*a* and 148*b* respectively decreases as approaching the corresponding gate electrodes 134*a*, 134*b*. The contact 148*a* has a top width W3$a_1$ larger than its bottom width W3$a_2$. The contact 148*b* has a top width W3$b_1$ larger than its bottom width W3$b_2$.

In some embodiments, the width of the contact 148*a* is substantially the same as the width of the contact 148*b*. For example, the top width W3$a_1$ of the contact 148*a* is substantially the same as the top width W3$b_1$ of the contact 148*b*, and the bottom width W3$b_2$ of the contact 148*a* is substantially the same as the bottom width W3$b_2$ of the contact 148*b*. The contact area between the contact 148*a* and the gate electrode 134*a* may be substantially the same as the contact area between the contact 148*b* and the gate electrode 134*b*.

Referring to FIG. 24A and FIG. 24B, in some embodiments, the top width W3$a_1$ of the gate contact 148*a*, the top width W3$b_1$ of the gate contact 148*b* and the top width W2*t* of the S/D contact 146 in the first region R1 may be substantially the same as each other. The bottom width W3$a_2$ of the gate contact 148*a* and the bottom width W3$b_2$ of the gate contact 148*b* may be the same, and larger than the bottom width W2*b* of the S/D contact 146.

In the embodiments of the disclosure, the high voltage transistor device and the low voltage transistor device are integrated in a single semiconductor device. The high voltage transistor device includes a thicker gate dielectric layer, and is partially embedded in the substrate to keep the height of gate electrode. Due to the height difference between the substrates in the high voltage device region and the low voltage device region, the thickness of dielectric features need to be removed for forming S/D contact holes in high voltage device region is larger than the thickness of dielectric features need to be removed for forming the S/D contact hole in low voltage device region. In accordance with some embodiments of the disclosure, the S/D contact of the high voltage transistor device and the S/D contact of the low voltage transistor device are formed separately, therefore, over etching issue in low voltage region during the process of forming contact hole is avoided, thereby avoiding junction leakage. Further, the S/D contact of the high voltage transistor device is formed to have a larger size, especially a larger bottom width, therefore, the contact resistance of the high voltage transistor device is reduced. Accordingly, the reliability and performance of the device are improved. On the other hand, the manufacturing process of the disclosure is compatible to HKMG process (e.g. third generation embedded superflash (ESF3) HKMG process).

In accordance with some embodiments of the disclosure, a semiconductor device includes a substrate having a first region and a second region, a first gate structure, a first S/D region, a first S/D contact, a second gate structure, a second S/D region and a second S/D contact. The first gate structure is disposed on the substrate of the first region. The first S/D region is disposed in the substrate within the first region and beside the first gate structure. The first S/D contact is connected to the first S/D region. The second gate structure is disposed on the substrate of the second region. The second S/D region is disposed in the substrate within the second region and beside the second gate structure. The second S/D contact is connected to the second S/D region. The contact area between the second S/D region and the second S/D contact is larger than a contact area between the first S/D region and the first S/D contact.

In accordance with some embodiments of the disclosure, a semiconductor device includes a substrate having a first region and a recessed second region, a low voltage transistor device disposed in the first region, and a high voltage transistor device disposed in the recessed second region. The low voltage transistor device includes a first gate structure on the substrate, a first S/D region in the substrate and beside the first gate structure, and a first S/D contact connected to the first S/D region. The high voltage transistor device includes a second gate structure on the substrate, a second S/D region in the substrate and beside the second gate structure, and a second S/D contact connected to the first S/D region. A source/drain contact resistance of the high voltage transistor device is lower than a source/drain contact resistance of the low voltage transistor device.

In accordance with some embodiments of the disclosure, a method of forming a semiconductor device includes the following processes: providing a semiconductor substrate; defining a first region and forming a recessed second region in the semiconductor substrate; forming a first gate structure on the substrate in the first region, and a second gate structure on the substrate in the recessed second region; forming a first source/drain (S/D) region in the substrate and beside the first gate structure, and a second S/D region in the substrate and beside the second gate structure; and forming a first S/D contact connected to the first S/D region and a second S/D contact connected to the second S/D region, wherein the first S/D contact and the second S/D contact are formed separately.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a semiconductor substrate;
   forming a first isolation structure and a second isolation structure for defining a first region and a second region in the semiconductor substrate;
   performing a recessing process, such that the semiconductor substrate and the second isolation structure in the second region are recessed;
   forming a first gate structure on the substrate in the first region, and a second gate structure on the substrate in the second region;
   forming a first source/drain (S/D) region in the substrate within the first region and beside the first gate structure, and a second S/D region in the substrate within the second region and beside the second gate structure, wherein the first isolation structure is disposed laterally aside and in contact with the first S/D region within the first region, and the second isolation structure is disposed laterally aside and in contact with the second S/D region within the second region, wherein a top surface of the second isolation structure in the second region is lower than a top surface of the first isolation structure in the first region; and
   forming a first S/D contact connected to the first S/D region and a second S/D contact connected to the second S/D region, wherein the first S/D contact and the second S/D contact are formed separately.

2. The method of claim 1, wherein the first S/D contact is formed after forming the second S/D contact, and forming the second S/D contact and the first S/D contact comprises:
   forming an interlayer dielectric layer to cover the first gate structure and the second gate structure;
   patterning the interlayer dielectric layer using a first mask layer as a mask to define a second contact hole in the interlayer dielectric layer;
   forming the second S/D contact in the second contact hole connected to the second S/D region;
   removing the first patterned mask layer;
   patterning the interlayer dielectric using a second mask layer as a mask to define a first contact hole in the interlayer dielectric layer;
   forming the first contact in the first contact hole connected to the first S/D region; and
   removing the second mask layer.

3. The method of claim 2, wherein the second mask layer is formed with a second opening for defining the second contact hole, the first mask layer is formed with a first opening for defining the first contact hole, and a width of the second opening is larger than a width of the first opening.

4. The method of claim 1, further comprising:
   forming a first gate contact connected to a first gate electrode of the first gate structure; and
   forming a second gate contact connected to a second gate electrode of the second gate structure.

5. The method of claim 4, wherein the first S/D contact, the first gate contact and the second gate contact are simultaneously formed after forming the second S/D contact.

6. The method of claim 1, wherein a height of the second S/D contact is larger than a height of the first S/D contact.

7. The method of claim 1, wherein a bottom width of the second S/D contact is larger than a bottom width of the first S/D contact.

8. A method of forming a semiconductor device, comprising:
   providing a semiconductor substrate;
   forming a first isolation structure and a second isolation structure for defining a first region and a second region in the semiconductor substrate;

performing a recessing process, such that the semiconductor substrate and the second isolation structure in the second region are recessed;

forming a first gate structure on the substrate in the first region, and a second gate structure on the substrate in the second region;

forming a first source/drain (S/D) region in the substrate within the first region and beside the first gate structure, and a second S/D region in the substrate within the second region and beside the second gate structure, wherein the first S/D region has a first silicide layer formed thereon, and the second S/D region has a second silicide layer formed thereon, and a top surface of the second isolation structure in the second region is substantially coplanar with a top surface of the second silicide layer; and forming a first S/D contact connected to the first S/D region and a second S/D contact connected to the second S/D region, wherein the first S/D contact and the second S/D contact are formed separately.

9. The method of claim 1, wherein the first S/D contact is formed after forming the second S/D contact, and forming the second S/D contact and the first S/D contact comprises:

forming an interlayer dielectric layer to cover the first gate structure and the second gate structure;

patterning the interlayer dielectric layer using a first mask layer as a mask to define a second contact hole in the interlayer dielectric layer;

forming the second S/D contact in the second contact hole connected to the second S/D region;

removing the first patterned mask layer;

patterning the interlayer dielectric using a second mask layer as a mask to define a first contact hole in the interlayer dielectric layer;

forming the first contact in the first contact hole connected to the first S/D region; and removing the second mask layer.

10. The method of claim 9, wherein the second mask layer is formed with a second opening for defining the second contact hole, the first mask layer is formed with a first opening for defining the first contact hole, and a width of the second opening is larger than a width of the first opening.

11. The method of claim 8, further comprising:

forming a first gate contact connected to a first gate electrode of the first gate structure; and forming a second gate contact connected to a second gate electrode of the second gate structure.

12. The method of claim 11, wherein the first S/D contact, the first gate contact and the second gate contact are simultaneously formed after forming the second S/D contact.

13. The method of claim 8, wherein a height of the second S/D contact is larger than a height of the first S/D contact, and a bottom width of the second S/D contact is larger than a bottom width of the first S/D contact.

14. The method of claim 8, wherein the top surface of the second isolation structure in the second region is lower than a top surface of the first isolation structure in the first region.

15. A method of forming a semiconductor device, comprising:

providing a semiconductor substrate;

forming a first isolation structure and a second isolation structure for defining a first region and a second region in the semiconductor substrate;

performing a recessing process to remove a portion of the semiconductor substrate and a portion of the second isolation structure;

forming a first gate structure on the substrate in the first region, and a second gate structure on the substrate in the second region;

forming a first source/drain (S/D) region in the substrate within the first region and beside the first gate structure, and a second S/D region in the substrate within the second region and beside the second gate structure, wherein the first S/D region has a first silicide layer formed thereon, and the second S/D region has a second silicide layer formed thereon, wherein the first isolation structure is disposed laterally aside and in contact with the first S/D region within the first region, and the second isolation structure is disposed laterally aside and in contact with the second S/D region within the second region, wherein a top surface of the second isolation structure in the second region is lower than a top surface of the first isolation structure in the first region; and forming a first S/D contact connected to the first S/D region and landing on the first silicide layer and a second S/D contact connected to the second S/D region and landing on the second silicide layer, wherein the first S/D contact and the second S/D contact are formed separately, wherein a contact area between the second silicide layer of the second S/D region and the second S/D contact is larger than a contact area between the first silicide layer of the first S/D region and the first S/D contact.

16. The method of claim 15, wherein the first S/D contact is formed after forming the second S/D contact, and forming the second S/D contact and the first S/D contact comprises:

forming an interlayer dielectric layer to cover the first gate structure and the second gate structure;

patterning the interlayer dielectric layer using a first mask layer as a mask to define a second contact hole in the interlayer dielectric layer;

forming the second S/D contact in the second contact hole connected to the second S/D region;

removing the first patterned mask layer;

patterning the interlayer dielectric using a second mask layer as a mask to define a first contact hole in the interlayer dielectric layer;

forming the first contact in the first contact hole connected to the first S/D region; and removing the second mask layer.

17. The method of claim 16, wherein the second mask layer is formed with a second opening for defining the second contact hole, the first mask layer is formed with a first opening for defining the first contact hole, and a width of the second opening is larger than a width of the first opening.

18. The method of claim 15, further comprising:

forming a first gate contact connected to a first gate electrode of the first gate structure; and forming a second gate contact connected to a second gate electrode of the second gate structure.

19. The method of claim 18, wherein the first S/D contact, the first gate contact and the second gate contact are simultaneously formed after forming the second S/D contact.

20. The method of claim 15, wherein a height of the second S/D contact is larger than a height of the first S/D contact, and a bottom width of the second S/D contact is larger than a bottom width of the first S/D contact.

* * * * *